(12) United States Patent
Tobita

(10) Patent No.: US 6,388,886 B1
(45) Date of Patent: May 14, 2002

(54) SEMICONDUCTOR MEMORY MODULE AND MODULE SYSTEM

(75) Inventor: Youichi Tobita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/714,966

(22) Filed: Nov. 20, 2000

(30) Foreign Application Priority Data

May 8, 2000 (JP) ........................................ 2000-134510

(51) Int. Cl.[7] ................................................ H05K 7/02
(52) U.S. Cl. ........................ 361/760; 361/777; 361/778; 361/782; 361/783; 361/803; 365/51; 365/63; 257/723; 257/726; 174/52.1
(58) Field of Search ................................ 361/772, 782, 361/783, 803, 760, 777, 748, 736, 737; 365/51, 63; 257/723, 724; 174/52.1

(56) References Cited

U.S. PATENT DOCUMENTS

| | | | |
|---|---|---|---|
| 4,751,482 A | * | 6/1988 | Fukuta et al. ................ 333/247 |
| 6,097,883 A | * | 8/2000 | Dell et al. .................... 395/282 |
| 6,111,757 A | * | 8/2000 | Dell et al. .................... 361/737 |
| 6,233,154 B1 | * | 5/2001 | Farnworth et al. .......... 361/752 |

FOREIGN PATENT DOCUMENTS

JP    4-35380    3/1992

* cited by examiner

Primary Examiner—Jayprakash N. Gandhi
Assistant Examiner—Thanh S. Phan
(74) Attorney, Agent, or Firm—Oblon, Spivak, McClelland, Maier & Neustadt, P.C.

(57) ABSTRACT

Provided is a semiconductor memory module capable of decreasing a parasitic capacitance and a parasitic inductance which are incidental to a signal transmission path, thereby reducing a distortion of a signal waveform. In a memory module, four DRAMs are provided on a muttilayer printed circuit board in one line corresponding to a direction of arrangement of external terminals thereof and board terminal groups of the module are provided to make a pair along two long sides of the multilayer printed circuit board. The DRAM has external terminals extended from one of the long sides and external terminals extended from the other long side. Board terminals and board terminals in the board terminal group of the module are connected to the DRAM, and board terminals and board terminals in the board terminal group TGB of the module are connected to the DRAM.

15 Claims, 17 Drawing Sheets

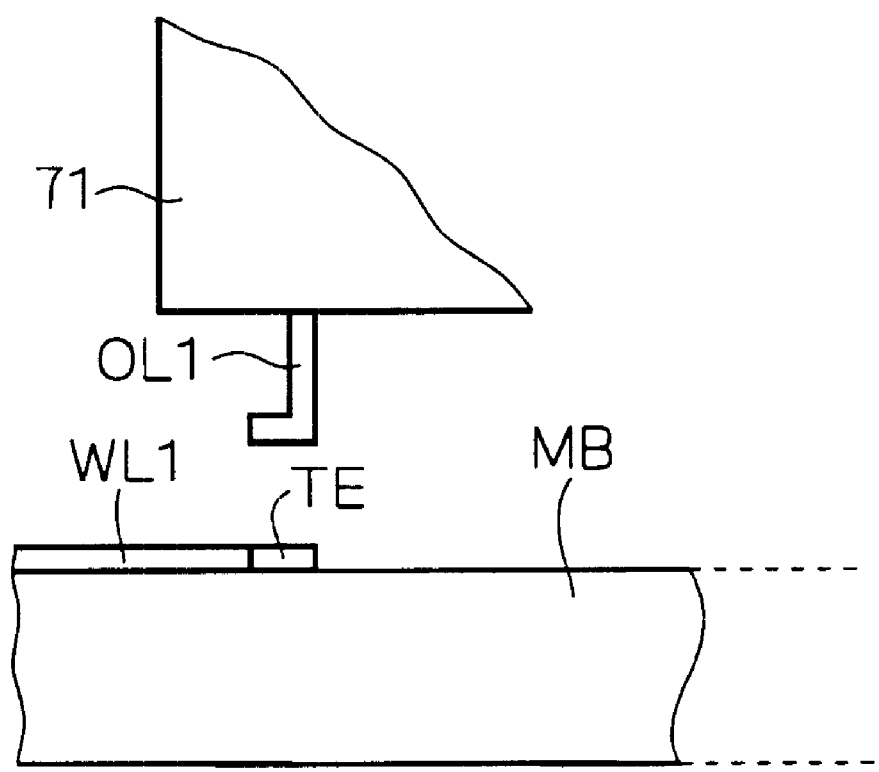

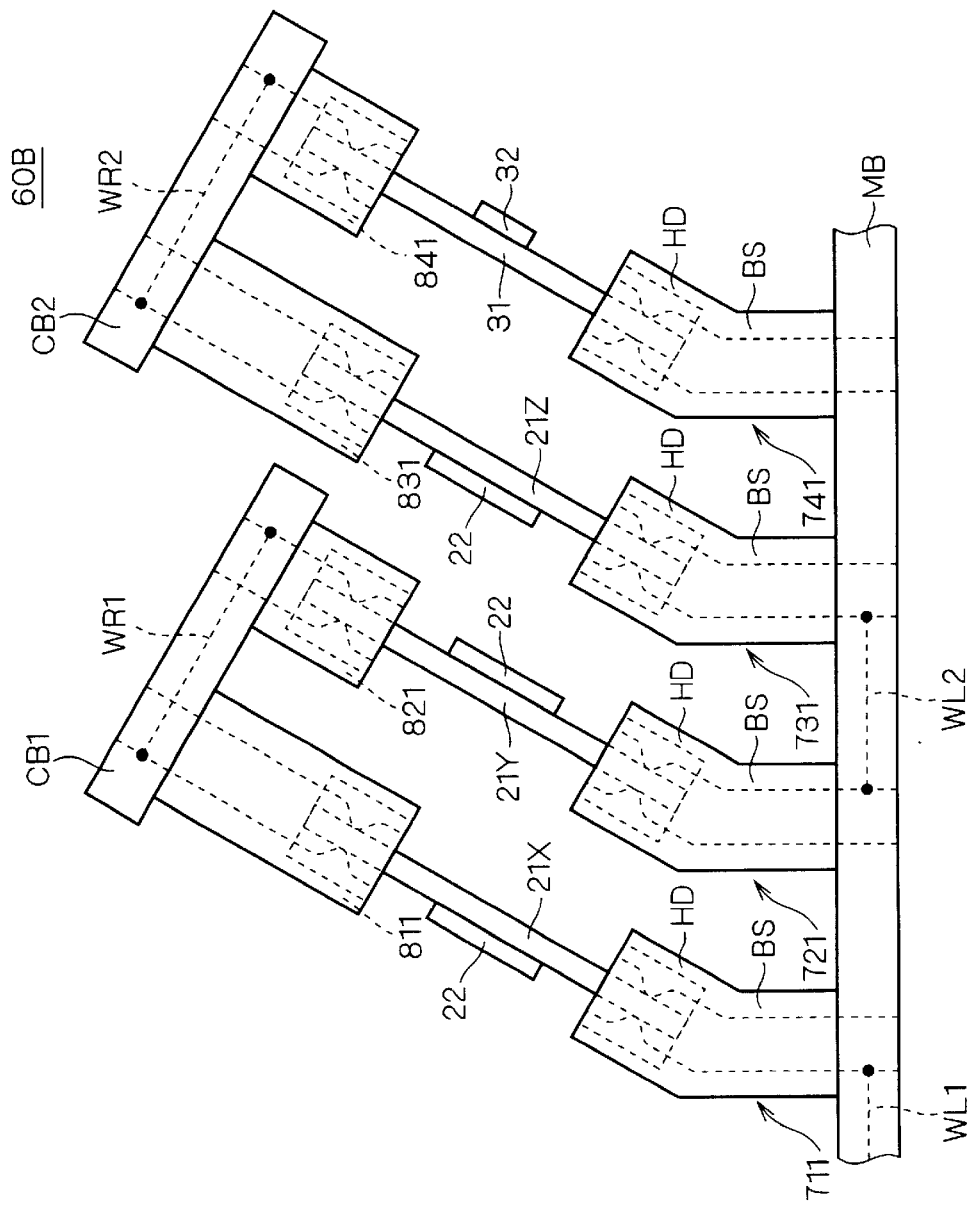

SEMICONDUCTOR MEMORY MODULE AND MODULE SYSTEM

BACKGROUND OF THE INVENTION

1. Field of the Invention

The present invention relates to a semiconductor memory module and more particularly to a structure of a semiconductor memory module corresponding to a high speed operation.

2. Description of the Background Art

With an increase in a processing speed of a semiconductor device, a speed of a signal transmitted and received between semiconductor devices is also increased. In particular, a digital signal has short rise and fall times.

When the rise and fall times of the signal are shortened, a signal is easily distorted over a printed circuit board on which the semiconductor device is to be mounted. Examples of the distortion include the case in which an overshoot voltage and an undershoot voltage are raised, the case in which a signal waveform becomes step-shaped when the waveform is, raised to reach a predetermined level, and the like.

The case in which a plurality of semiconductor memory modules having a plurality of semiconductor memories provided thereon are mounted will be taken as an example. An output impedance of a driver circuit for outputting a signal to be input in common with the semiconductor memory modules is usually matched with a characteristic impedance of a transmission path through which the signal is transmitted. However, the impedances are mismatched between the driver circuit and the transmission path due to a parasitic capacitance and a parasitic inductance which are incidental to a branch line connected to each module of the transmission path, and the signal is reflected and is thereby distorted in some cases.

When the signal is reflected, an overshoot or an undershoot is liable to be generated on the signal waveform. When the overshoot voltage and the undershoot voltage are raised, ringing is generated correspondingly. When the ringing thus generated exceeds a threshold of a circuit for receiving the signal, a false signal is generated to cause sprious switching.

In the case in which the parasitic capacitance and the parasitic inductance have great values, the distortion is more increased. Also in the case in which there are a large number of branches on the same transmission path, the distortion is increased.

As described above, the processing speed of the semiconductor device is increased so that the mismatch of the impedances is caused between the driver circuit and the signal transmission path due to the parasitic capacitance and the parasitic inductance which are incidental to the transmission path. Consequently, the reflection of the signal is caused so that the signal is distorted. Thus, the overshoot and the undershoot are liable to be generated on the signal waveform.

SUMMARY OF THE INVENTION

In order to solve the above-mentioned problem, it is an object of the present invention to provide a semiconductor memory module capable of decreasing a parasitic capacitance and a parasitic inductance which are incidental to a signal transmission path, thereby reducing a distortion of a signal waveform.

A first aspect of the present invention is directed to a semiconductor memory module comprising a Wiring board, at least one semiconductor memory provided on at least one main surface of the wiring board and having a plurality of external terminals, a plurality of first board terminals and a plurality of second board terminals which are provided line symmetrically with respect to two opposed sides of the wiring board corresponding to the plurality of external terminals, respectively, and a wiring for electrically connecting one of the plurality of external terminals to one pair of the plurality of first and second board terminals corresponding thereto.

A second aspect of the present invention is directed to the semiconductor memory module, wherein the at least one semiconductor memory is a plurality of semiconductor memories, and the plurality of external terminals of the semiconductor memories and the plurality of first and second board terminals are provided in the same direction.

A third aspect of the present invention is directed to the semiconductor memory module, wherein the plurality of semiconductor memories are provided in a plurality of lines in parallel with each other.

A fourth aspect of the present invention is directed to the semiconductor memory module, wherein the wiring board has first and second main surfaces, the first main surface including a first group of semiconductor memories having at least one of the plurality of semiconductor memories, and the plurality of first and second board terminals corresponding to the plurality of external terminals of the first group of semiconductor memories and the wiring connecting the plurality of first and second board terminals provided on the first main surface, and the second main surface including a second group of semiconductor memories having at least one of the plurality of semiconductor memories, and the plurality of first and second board terminals corresponding to the plurality of external terminals of the second group of semiconductor memories and the wiring connecting the plurality of first and second board terminals provided on the second main surface.

A fifth aspect of the present invention is directed to a module system mounting a plurality of semiconductor memory modules according to the first aspect of the present invention, comprising at least one first connector for electrically connecting the semiconductor memory modules, and a base mounting the at least one first connector and the semiconductor memory modules connected to the at least one first connector, the at least one first connector having a connecting portion connecting the plurality of first and second board terminals to respective side surfaces of two sides parallel with a direction in which the first and second board terminals are arranged.

A sixth aspect of the present invention is directed to the module system, wherein the base has two second connectors fixedly provided on both ends in a direction of array of the plurality of semiconductor memory modules, at least one of the two second connectors being connected to any of the plurality of first and second board terminals in the plurality of semiconductor memory modules which is not connected to the at least one first connector.

A seventh aspect of the present invention is directed to the module system, further comprising a resistance module mounting a plurality of resistive elements having one of ends electrically connected to any of the plurality of first and second board terminals and the other end electrically connected to any of the plurality of first and second board terminals through the at least one first connector.

An eighth aspect of the present invention is directed to a module system having a plurality of semiconductor memory modules according to the first aspect of the present invention, the main surfaces of the semiconductor memory modules being opposed to each other, the module system comprising a board and a connecting structure, the semiconductor memory modules being divided into at least one first module in which the first board terminals are connected to at least one first connector mounted on the board, and at least one second module in which the second board terminals are connected to at least one second connector mounted on the board, the second board terminals of the at least one first module being connected to at least one third connector, the first board terminals of the at least one second module being connected to at least one fourth connector, the at least one third connector and the at least one fourth connector being electrically connected through the connecting structure, and the at least one first module and the at least one second module being alternately provided.

A ninth aspect of the present invention is directed to the module system, wherein the connecting structure is a connecting board for mounting the at least one third connector and the at least one fourth connector and for electrically connecting the at least one third connector and the at least one fourth connector through a wiring provided on a main surface or an inner part thereof.

A tenth aspect of the present invention is directed to the module system, wherein the at least one first module and the at least one second module are provided to make a pair such that respective main surfaces on a side where the at least one semiconductor memory is provided are turned in opposite directions.

An eleventh aspect of the present invention is directed to the module system, wherein the first and second modules are provided such that respective main surfaces on a side where the at least one semiconductor memory is provided are turned in the same direction.

A twelfth aspect of the present invention is directed to the module system, wherein the first and second modules have respective main surfaces provided perpendicularly to the main surface of the board.

A thirteenth aspect of the present invention is directed to the module system, wherein the first and second modules have respective main surfaces inclined to the main surface of the board.

According to the first aspect of the present invention, the first and second board terminals provided on the wiring board and one of the external terminals of at least one semiconductor memory are electrically connected through the wiring. Therefore, in the case in which a plurality of modules having the same structures are to be electrically connected to a signal transmission path, predetermined external terminals of at least one semiconductor memory of each module can be connected to the signal transmission path at a short distance. As a result, a branch length on the same transmission path can be decreased, a parasitic capacitance and a parasitic inductance which are incidental to the signal transmission path can be reduced, and a distortion of a signal waveform can be reduced.

According to the second aspect of the present invention, the first and second board terminals are provided in parallel with the external terminals of the semiconductor memories. Therefore, a wiring layout can be obtained efficiently.

According to the third aspect of the present invention, the semiconductor memories are arranged in a plurality of lines in parallel with each other. Therefore, a mounting density of the semiconductor memories can be enhanced.

According to the fourth aspect of the present invention, the semiconductor memory is provided on the first and second main surfaces of the wiring board. Therefore, it is possible to increase the number of the semiconductor memories to be mounted per module.

According to the fifth aspect of the present invention, the semiconductor memory modules can be electrically connected to each other at a short distance through the connection of the first connector to the first and second board terminals. As a result, the branch length on the same transmission path can be decreased, the parasitic capacitance and the parasitic inductance which are incidental to the signal transmission path can be reduced, and the distortion of the signal waveform can be reduced. Moreover, the semiconductor memory modules can be connected to each other through the first connector such that the main surface of the wiring board is present in the same plane, and the semiconductor memory modules can be connected easily. Thus, a large capacity module system can be implemented readily.

According to the sixth aspect of the present invention, the second connector is fixedly provided on one of the ends of the base. Therefore, it is possible to surely regulate the positions of the arranged semiconductor memory modules.

According to the seventh aspect of the present invention, it is possible to obtain a place of a terminating resistor for matching an output impedance of signal output means for outputting a signal to be input to the semiconductor memory module, for example, a driver circuit with a characteristic impedance of a transmission path through which the signal is transmitted, thereby reducing the distortion of the signal.

According to the eighth aspect of the present invention, the main surfaces of the semiconductor memory modules are opposed to each other, the third and fourth connectors are electrically connected through the connecting structure, and the first board terminals of the first module and the second board terminals of the second module are electrically connected to each other. Consequently, an area occupied by the module system on the board can be reduced and a module system having a small size and a large capacity can be implemented.

According to the ninth aspect of the present invention, the connecting board for electrically connecting at least one third connector and at least one fourth connector through the wiring provided on the main surface or the inner part thereof is used as the connecting structure. Therefore, a wiring length is not changed, the third and fourth connectors are fixed, and the first and second modules can be fixed reliably.

According to the tenth aspect of the present invention, the respective main surfaces of the first and second modules on the side where at least one semiconductor memory is provided are arranged to make a pair in opposite directions. Therefore, in the case in which plural sets of first and second modules are present, any signal path length between the third and fourth connectors to be electrically connected through the connecting structure can be set to be equal if an interval between the first and second connectors is equal.

According to the eleventh aspect of the present invention, the respective main surfaces of the first and second modules on the side where at least one semiconductor memory is provided are turned in the same direction. Therefore, in the case in which plural sets of first and second modules are present, both a signal path length between the third and fourth connectors to be electrically connected through the connecting structure and a signal path length between the first and second connectors of the set of adjacent first and second modules which are electrically connected through the board can be set to be equal if an interval between the first and second connectors is equal.

According to the twelfth aspect of the present invention, the respective main surfaces of the first and second modules are provided perpendicularly to the main surface of the board. Therefore, the area occupied by the module system on the board can be reduced most effectively.

According to the thirteenth aspect of the present invention, the respective main surfaces of the first and second modules are inclined to the main surface of the board. Therefore, the area occupied by the module system on the board can be reduced effectively.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 23 to 26 are views illustrating an example of a structure of a connecting portion of a connector and a mother board, FIG. 27 is a side view showing a structure of a module system according to a second variant, and FIG. 28 is a side view showing a structure of a module system according to a third variant.

DESCRIPTION OF THE PREFERRED EMBODIMENTS

<A. Preferred Embodiment>

<A-1. Basic Structure>

Figure 1:
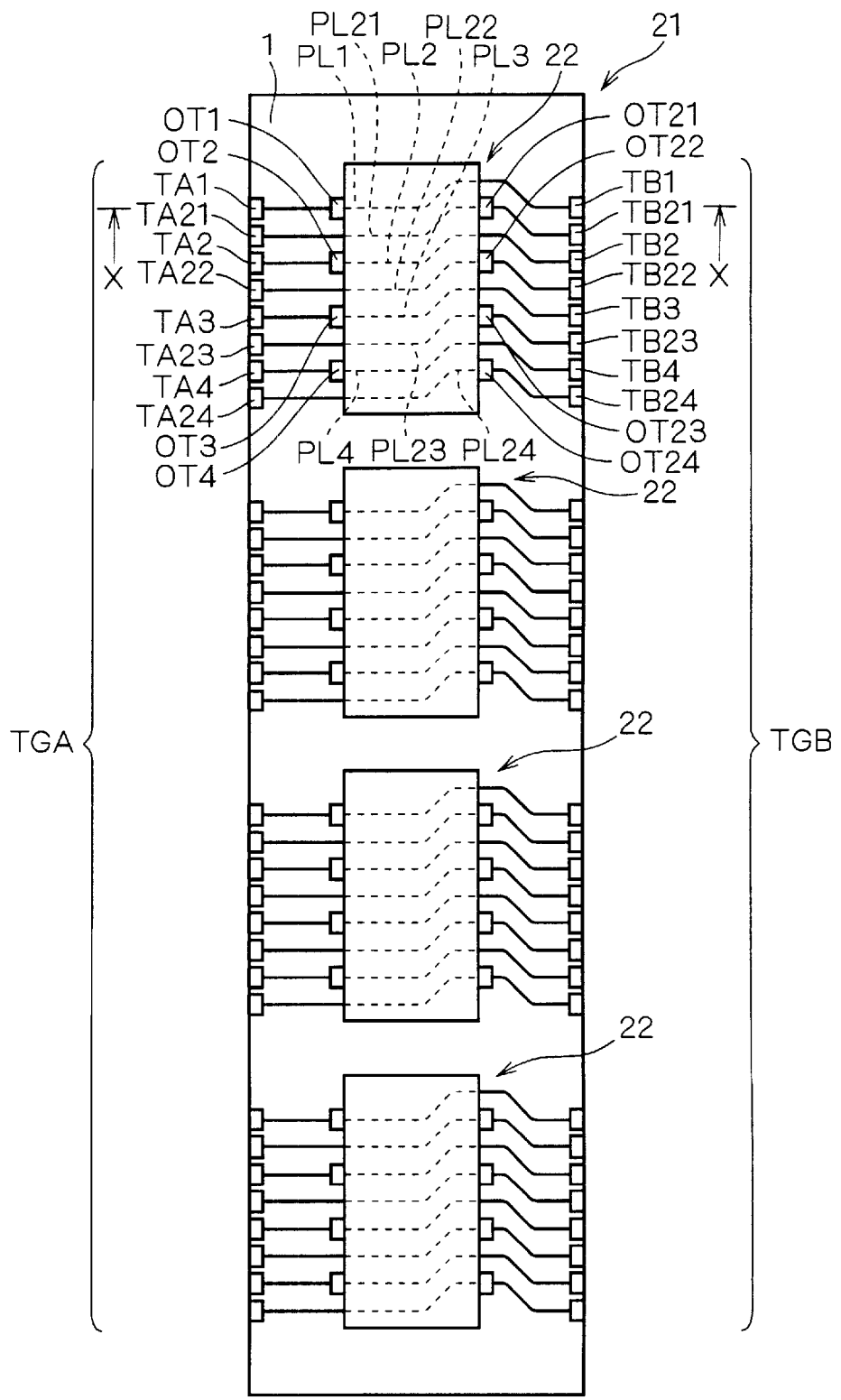
FIG. 1 is a plan view illustrating a basic structure of a semiconductor memory module according to the present invention.

FIG. 1 is a plan view showing a basic structure of a semiconductor memory module according to the present invention, illustrating a memory module 21 having four DRAMs (Dynamic Random Access Memory) 22 mounted on a multilayer printed circuit board 1.

The multilayer printed circuit board 1 is provided with a plurality of boards (for example, six to eight layers) made of glass epoxy, and has an elongated rectangular shape such that the four ERAMs 22 are provided in a line corresponding to a direction of arrangement of external terminals thereof. Board terminal groups TGA and TGB of the module are provided to make a pair along two long sides of the multilayer printed circuit board 1.

The DRAM 22 is a package referred to as a so-called type 2 of a TSOP (Thin Small Outline Package), and has an external terminal provided in two directions of the long side. The DRAM 22 typically represents an actual package and the number and shape of the external terminals are simplified.

Moreover, all the DRAMs 22 have the same structures. In the following description, the endmost DRAM 22 will be taken as an example and the description of other DRAMs 22 will be omitted.

The DRAM 22 shown in FIG. 1 has external terminals OT1 to OT4 extended from one of long sides and external terminals OT21 to OT24 extended from the other long side. All of the external terminals OT1 to OT4 and the external terminals OT21 to OT24 are electrically connected onto electrodes (not shown) provided corresponding thereto over the multilayer printed circuit board 1.

Board terminals TA1 to TA4 and board terminals TA21 to TA24 in the board terminal group TGA of the module are connected to the DRAM 22, and board terminals TB1 to TB4 and board terminals TB21 to TB24 in the board terminal group TGB are connected to the DRAM 22.

The connection of the terminals will be described below. As shown in FIG. 1, the board terminal TA1 of the module is electrically connected to the external terminal OT1 of the DRAM 22 and the board terminal TB1 of the module through a printed wiring PL1 provided on an upper main surface of the multilayer printed circuit board 1.

More specifically, the board terminal TA1 and an electrode (not shown) to which the external terminal OT1 is connected, and the electrode to which the external terminal OT1 is connected and the board terminal TB1 are connected through the printed wiring PL1 provided on the upper main surface of the multilayer printed circuit board 1, respectively.

Similarly, the board terminal TA21 is electrically connected to the external terminal OT21 and the board terminal TB21 through a printed wiring PL21, the board terminal TA2 is electrically connected to the external terminal OT2 and the board terminal TB2 through a printed wiring PL2, the board terminal TA22 is electrically connected to the external terminal OT22 and the board terminal TB22 through a printed wiring PL22, the board terminal TA3 is electrically connected to the external terminal OT3 and the board terminal TB3 through a printed wiring PL3, the board terminal TA23 is electrically connected to the external terminal OT23 and the board terminal TB23 through a printed wiring PL23, the board terminal TA4 is electrically connected to the external terminal OT4 and the board terminal TB4 through a printed wiring PL4, and the board terminal TA24 is electrically connected to the external terminal OT24 and the board terminal TB24 through a printed wiring PL24.

Each of the printed wirings PL1 to PL4 and PL21 to PL24 is provided to connect the terminals at a short distance.

In the above description, it is premised that the memory module 21 is provided with the DRAMs 22. It is apparent that the present invention can be applied to a memory module provided with only one semiconductor memory.

<A-1-1. First Variant of Wiring Layout>

While the board terminals TA1 to TA4 and TB1 to TB4 and the board terminals TA21 to TA24 and TB21 to TB24 are connected through the printed wirings PL1 to PL4 and the printed wirings PL21 to PL24 which are provided on the multilayer printed circuit board 1 respectively as described above, the present invention is not restricted thereto.

Figure 2:
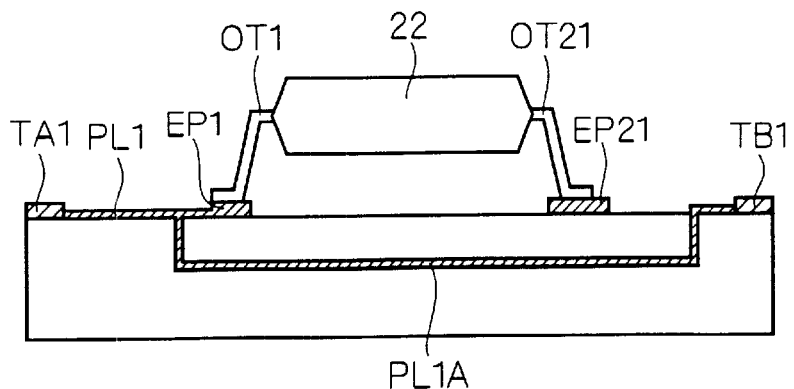
FIGS. 2 to 4 are sectional views showing a variant of a wiring layout of the basic structure of the semiconductor memory module according to the present invention.

FIG. 2 is a sectional view corresponding to a state in which the memory module 21 of FIG. 1 is taken along the line X—X connecting the board terminals TA1 and TB1. As shown in FIG. 2, the board terminal TA1 is connected through the printed wiring PL1 provided on an upper main surface of the multilayer printed circuit board 1 to an electrode EP1 to which the external terminal OT1 is connected, while the electrode EP1 and the board terminal TB1 are connected through a printed wiring PL1A provided on a board (not shown) of a lower layer in the multilayer printed circuit board 1.

It is preferable that the printed wirings PL1 and PL1A should be connected through a contact hole which is formed from the main surface of the multilayer printed circuit board 1 to an inner portion to reach the printed wiring PL1A. A conductor may be filled in the contact hole to connect the printed wirings PL1 and PL1A or an internal wall of the contact hole may be covered with a conductor layer to connect the printed wirings PL1 and PL1A. Moreover, the contact hole may be a non-through hole as shown in FIG. 2 or a through hole.

Moreover, it is sufficient that the printed wiring PL1 connects the board terminal TA1 and the electrode EP1 and does not need to be provided on the multilayer printed circuit board 1 below the DRAM 22.

The printed Airing PL1A appears on the multilayer printed circuit board 1 in the vicinity of the board terminal TB 1 and is connected to the board terminal TB1.

Although an electrode EP21 to which the external terminal OT21 is connected is shown together, a printed wiring to be connected to the electrode EP21 is omitted for simplicity.

Thus, a part of the printed wiring connecting the terminals can be provided on a lower board constituting the multilayer printed circuit board 1 by utilizing the fact that the memory module 21 is provided on the multilayer printed circuit board 1, and a wiring density can be more reduced so that the wiring can be obtained more easily as compared with the case in which all the printed wirings a re provided on the upper main surface. Moreover, the wiring density can be more reduced as compared with the case in which all the printed wirings are provided on the main surface.

Furthermore, the wiring is not provided on a lower main surface of the multilayer printed circuit board 1. Therefore, the DRAM can also be provided on the lower main surface side.

<A-1-2. Second Variant of Wiring Layout>

Figure 3:
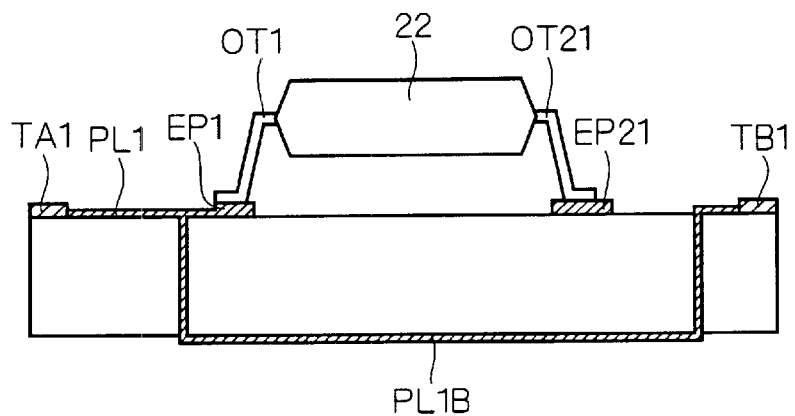

A structure shown in FIG. 3 can also be employed. FIG. 3 is a sectional view corresponding to a state in which the memory module 21 is cut in the same portion as that in FIG. 2. As shown in FIG. 3, the board terminal TA1 is connected through the printed wiring PL1 provided on the main surface of the multilayer printed circuit board 1 to the electrode EP1 to which the external terminal OT1 is connected, and the electrode EP1 and the board terminal TB1 are connected to each other through a printed wiring PL1B provided on a lower main surface of the muitilayer printed circuit board 1.

It is preferable that the printed wirings PL1 and PL1B should be connected through a contact hole provided to penetrate the muitilayer printed circuit board 1.

Moreover, it is sufficient that the printed wiring PL1 connects the board terminal TA1 and the electrode EP1 and does not need to be provided on the multilayer printed circuit board 1 below the DRAM 22.

The printed wiring PL1B appears on the multilayer printed circuit board 1 in the vicinity of the board terminal TB1 and is connected to the board terminal TB1.

Thus, a part of the printed wiring connecting the terminals is provided on the lower main surface of the multilayer printed circuit board 1 so that a wiring density can be more reduced and a wiring can be obtained more easily as compared with the case in which all the printed wirings are provided on the upper main surface.

Moreover, the wiring density can be more reduced than that in the case in which all the printed wirings, are provided on the upper main surface. Thus, it is possible to prevent troubles such as a short circuit between the wirings from being made.

Furthermore, a part of the printed wiring can easily be provided on the lower main surface of the multilayer printed circuit board 1 and does not need to be previously fabricated differently from the case in which a part of the printed wiring is provided in the multilayer printed circuit board 1. Therefore, a manufacturing process can also be simplified.

<A-1-3. Third Variant of Wiring Layout>

Figure 4:
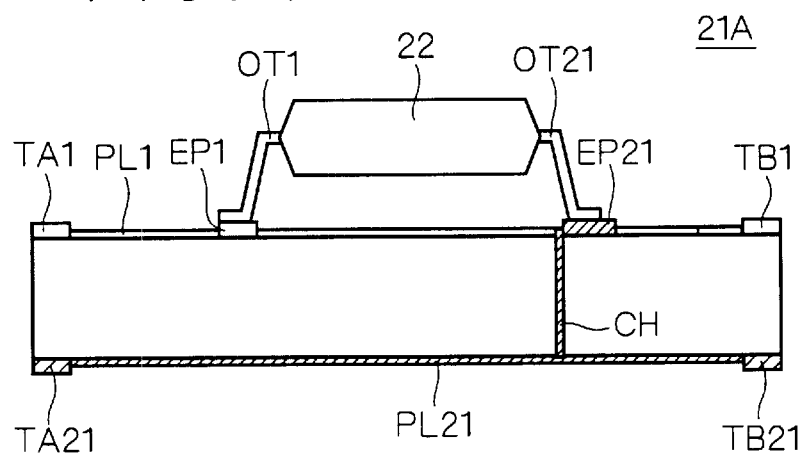

A structure shown in FIG. 4 can also be employed. FIG. 4 is a sectional view corresponding to a state in which a memory module 211 of FIG. 5 is taken along the line Y—Y connecting board terminals TA21 and TB21 differently from the memory module 21 shown in FIG. 1.

Figure 5:
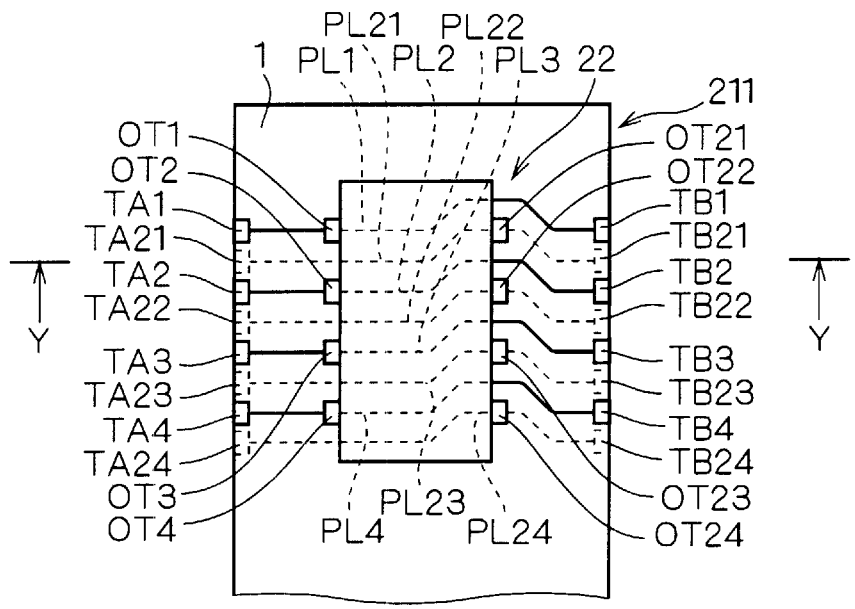
FIG. 5 is a partial plan view showing a variant of the basic structure of the semiconductor memory module according to the present invention.

The memory module 211 shown in a plan view of FIG. 5 has board terminals TA21 to TA24 and TB21 to TB24 thereof provided on the lower main surface side of a multilayer printed circuit board 1 and also has printed wirings PL21 to PL24 provided on the lower main surface side of the multilayer printed circuit board 1. For simplicity, FIG. 5 shows only a region where one DRAM 22 is mounted.

With the sectional structure shown in FIG. 4, a board terminal TA1 is electrically connected to an external terminal OT1 of the DRAM 22 and a board terminal TB1 of the module through a printed wiring PL1 provided on an upper main surface of the multilayer printed circuit board 1, and the board terminal TA21 is connected to the board terminal TB21 through the printed wiring PL21 provided on the lower main surface of the multilayer printed circuit board 1 and is connected through a contact hole CH penetrating the multilayer printed circuit board 1 to an electrode EP21 to which an external terminal OT21 is connected.

Thus, half of the board terminals of the module and half of the printed wirings connecting the terminals are provided on the lower main surface of the multilayer printed circuit board 1. Consequently, a wiring density can be more reduced and a wiring can be obtained more easily as compared with the case in which all the printed wirings are provided on the upper main surface.

Moreover, the printed wiring can easily be provided on the lower main surface of the multilayer printed circuit board 1, and does not need to be previously fabricated differently from the case in which a part of the printed wiring is provided in the multilayer printed circuit board 1. Therefore, a manufacturing process can also be simplified.

<A-2. Practical Example>

As described above, any of the board terminals of the board terminal groups TGA and TGB provided on the multilayer printed circuit board 1 is connected to one of the external terminals, of the DRAM without a great detour. Therefore, in the case in which a plurality of memory modules similar to the memory module 21 are to be electrically connected, a signal transmission path (signal wiring) and a predetermined external terminal of a predetermined DRAM of each memory module can be connected to each other at a short distance.

As a practical example of the semiconductor memory module according to the present invention, a structure of a module system having a plurality of memory modules 21 shown in FIG. 1 will be described below with reference to FIG. 6.

Figure 6:
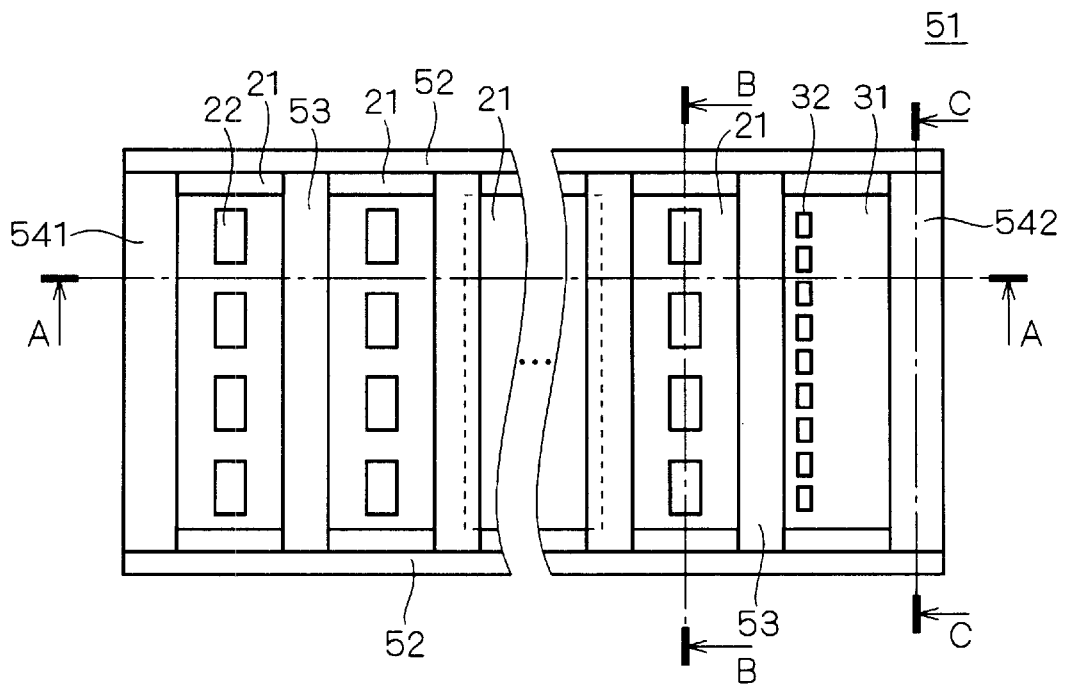
FIG. 6 is a plan view illustrating a structure of a practical example of the semiconductor memory module according to the present invention.

FIG. 6 is a plan view showing a module system 51 having a plurality of memory modules 21 shown in FIG. 1 illustrating a structure of the module system seen from the upper main surface side of the memory module 21.

As shown in FIG. 6, the module system 51 is provided with a plurality of memory modules 21 which are arranged in a direction of a short side, that is, a direction of connection of the board terminal groups TGA and TGB (see FIG. 1). The module system 51 has a base 52 for regulating a position of the memory module 21, a connector 53 provided between the memory modules 21 for electrically connecting the memory modules 21, and a connector 541 fixedly provided on one of ends of the base 52 in a longitudinal direction (that is, a direction of array of the memory module 21) for electrically connecting the memory module 21 to a mother board (not shown) mounting the module system 51.

A movable connector 542 is provided on the other end of the base 52 in the longitudinal direction, and a resistance module 31 mounting a plurality of terminating resistors 32 on the multilayer printed circuit board 1 is connected to the connector 542.

An example of a structure of the resistance module 31 will be described below with reference to FIGS. 19 and 20, in which a board terminal group (not shown) is provided along one of long sides and is connected to the connector 53, and the other long side is inserted into the connector 542 and a position thereof is regulated.

The terminating resistor 32 is provided for terminating the signal wiring to match an output impedance of a driver circuit (provided on the mother board which is not shown) for outputting a signal to be input to each memory module 21 with a characteristic impedance of a transmission path (signal wiring) through which the signal is transmitted, thereby reducing a distortion of the signal, and has an impedance which is almost equal to the characteristic impedance of the signal wiring. A chip resistor is used for the terminating resistor 32.

Figure 7:
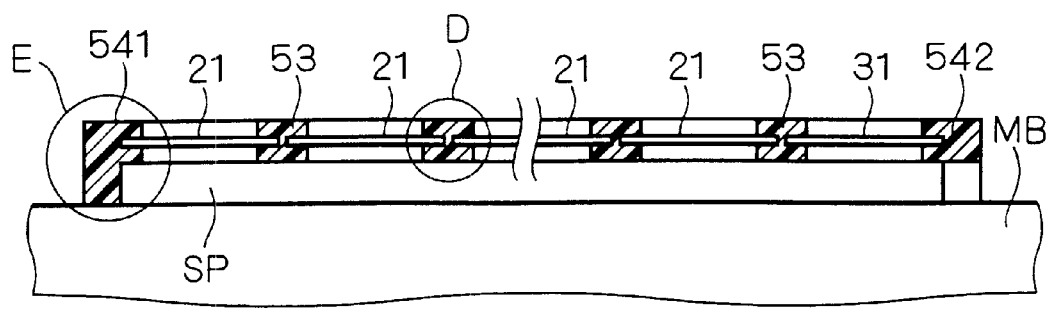
FIGS. 7 to 9 are sectional views illustrating the structure of the practical example of the semiconductor memory module according to the present invention.
Figure 8:
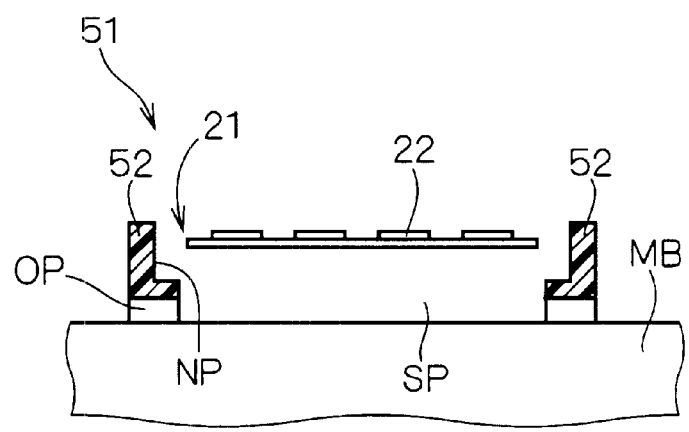
Figure 9:
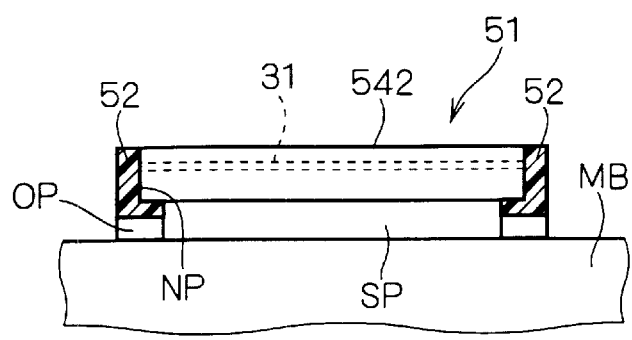

FIG. 7 is a sectional view showing the module-system 51 of FIG. 6-taken along the line A—A, FIG. 8 is a sectional view taken along the line B—B and FIG. 9 is a sectional view taken along the line C—C.

As shown in FIG. 7, the memory module 21 provided on the leftmost end has such a structure that board terminal groups (not shown) provided along two long sides are connected to the connectors 541 and 53, and other memory modules 21 have both board terminal groups connected to the connector 53. In any case, the positions of the memory modules 21 are regulated through the connector.

As shown in FIG. 8, the base 52 of the module system 51 is formed of a resin, is constituted to have a space SP between a mother board MB and the memory module 21, and has an opening OP provided under both long sides thereof. The opening OP penetrates a lower portion of the base 52 to communicate with the space SP.

A characteristic impedance of the mother board MB is made identical to that of each of the memory module 21 and the resistance module 31.

Figure 10:
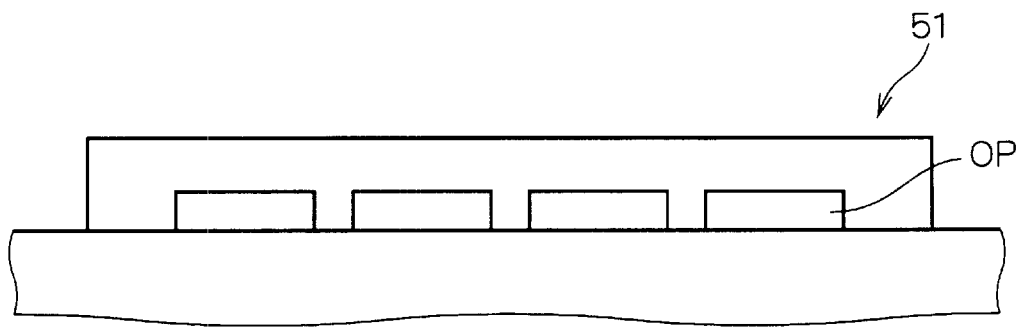
FIG. 10 is a view illustrating an external structure of the practical example of a semiconductor memory module according to the present invention.

FIG. 10 is a view showing the appearance of the module system 51 seen from the long side. In FIG. 10, a plurality of openings OP are provided along the long side of the base 52.

Thus, the provision of the openings OP can circulate air in the space SP enclosed by the base 52. Therefore, a radiation efficiency of heat generated by the DRAM 22 can be enhanced.

As shown in FIGS. 8 and 9, the base 52 has a notch portion NP on the inside such that a section of the long side has an L shape, and the connectors 53 and 542 are mounted on the notch portion NP. The connectors 53 and 542 are basically mounted on the notch portion NP and may be fixed with a screw after the module system 51 is assembled, which will be described below with reference to FIG. 13.

Next, structures of the connectors 53 and 541 will be described with reference to FIGS. 11 and 12.

Figure 11:
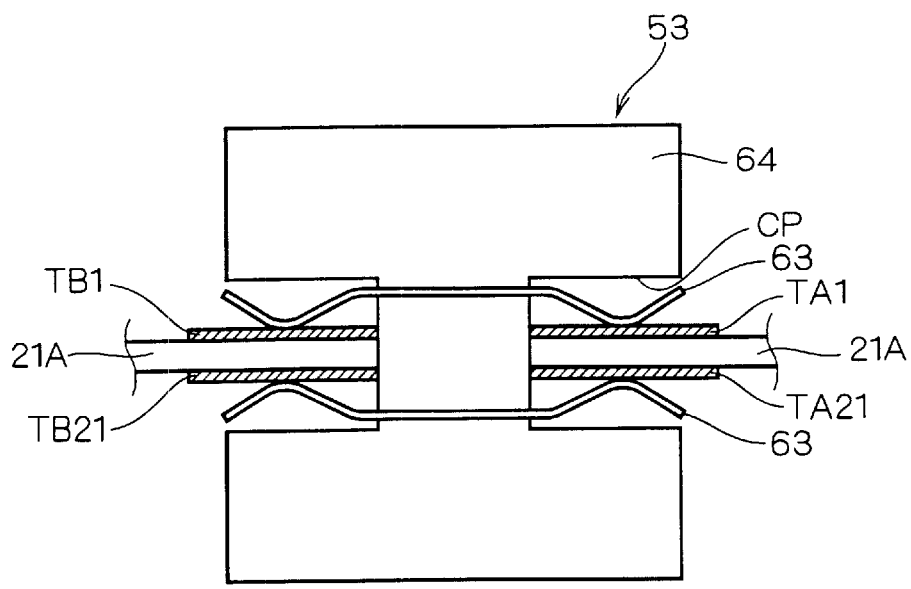
FIG. 11 is a sectional view showing a structure of a connector for connecting memory modules.

FIG. 11 is a sectional view showing the structure of the connector 53, which is equivalent to the detailed view of a region D in FIG. 7. An elongated body portion 64 formed of a resin such as plastics in the connector 53 has a connecting portion CP to be a concave part on two long sides extended in a direction of array of the DRAMs 22.

The connecting portion CP includes a contactor 63 provided in plural pairs through the body portion 64 electrically independently corresponding to each board terminal of the memory module 21. For example, the board terminals TA1 and TA21 of the memory module 21A described with reference to FIG. 4 are inserted into the right CP and the board terminals TB1 and TB21 of the memory module 21A are inserted into the left CP.

Consequently, the board terminal TB1 of the memory module 21A on the left side and the board terminal TA1 of the memory module 21A on the right side in the drawing are electrically connected to each other through the upper contactor 63, and the board terminal TB21 of the memory module 21A on the left side and the board terminal TA21 of the memory module 21A on the right side in the drawing are electrically connected to each other through the lower contactor 63.

A pair of contactors 63 are opposed to each other, are formed of an elastic material to surely cause the board terminals TA1 and TA21 to come in contact with each other, and are constituted to interpose the memory module 21A therebetween. A beryllium copper alloy or the like is used for the material of the contactor 63.

Moreover, the: board terminal groups TGA and TGB of the memory module 21A are formed of copper electrodes plated with gold in order to have a corrosion-resistance property.

Also in the case in which the board terminal is provided on only one of the main surfaces as in the memory module 21 shown in FIG. 1, it is desirable that a pair of contactors 63 should be provided in order to interpose the multilayer printed circuit board 1 therebetween and to ensure the contact with the board terminal.

Figure 12:
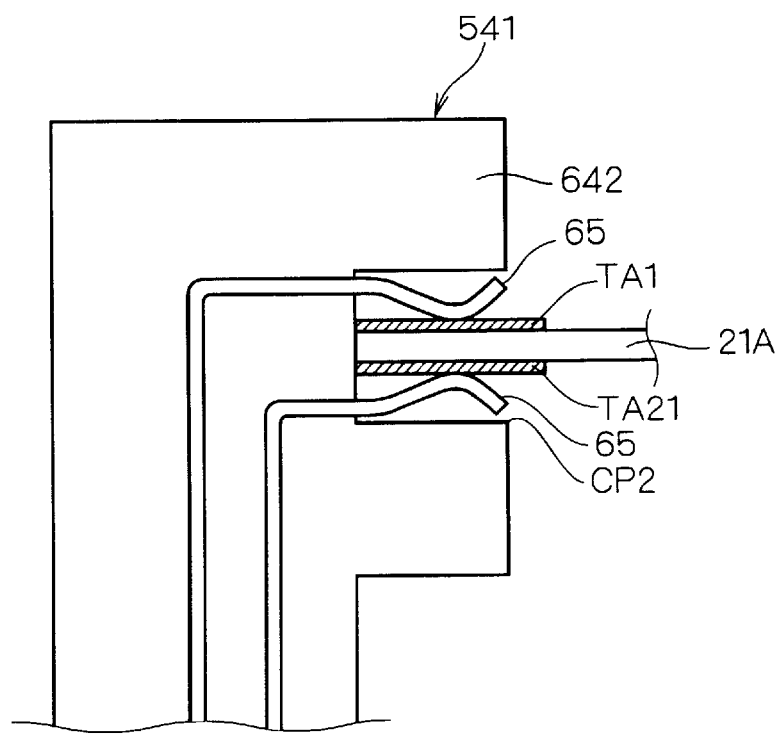
FIG. 12 is a sectional view showing a structure of a connector constituting an end of a module system.

FIG. 12 is a sectional view showing the structure of the connector 541, which is equivalent to the detailed view of a region E in FIG. 7. An elongated body portion 642 formed of a resin such as plastics has a connecting portion CP2 to be a concave part on two long sides extended in a direction of array of the DRAMs 22.

The connecting portion CP2 includes a pair of contactors 65 having ends connected to the board terminals TA1 and TA21 of the memory module 21A described with reference to FIG. 4, for example. A pair of contactors 65 are the same as the contactor 63 of the connector 53 except that they are bent and extended toward the mother board side in the body portion 642 having an L-shaped section and the other ends which are not shown are connected to predetermined wirings on the mother board.

Figure 13:
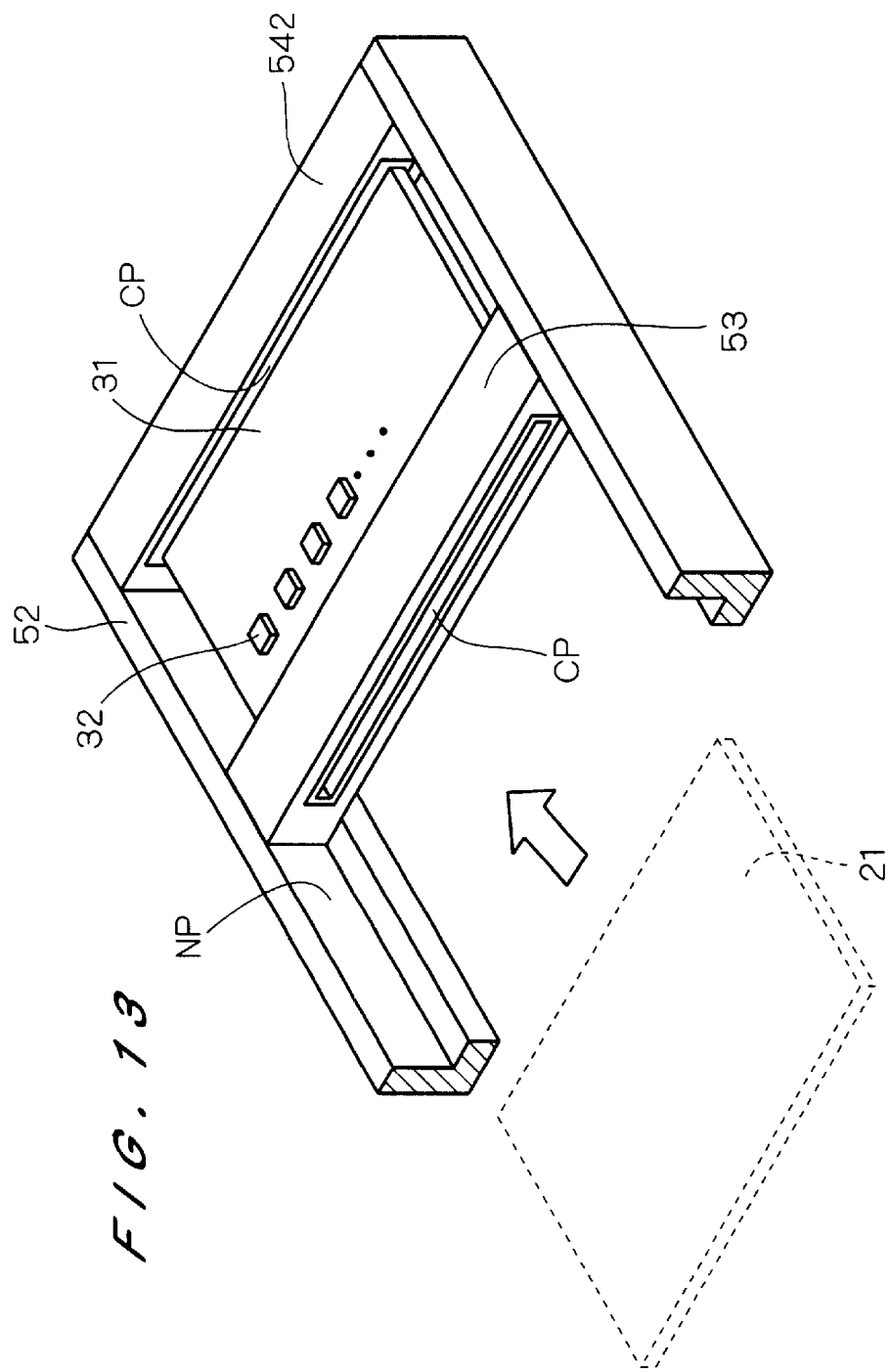
FIG. 13 is a perspective view illustrating a method of assembling the module system.

Next, an assembling method will be described with reference to a partial perspective view of FIG. 13 showing the module system 51.

FIG. 13 is a perspective view showing a portion on which a resistance module 31 of the module system 51 is mounted.

First of all, a long side of the resistor module 31 having a plurality of chip resistors 32 mounted thereon where a board terminal group is not provided is inserted into a connecting port CP of the connector 542. Then, the connector 53 is slid over the notch portion NP of the base 52 to approach the resistance module 31, and a long side of the resistance module 31 where the board terminal group is provided is inserted into one of the connecting ports (not shown) of the connector 53.

As described above, the connector 542 is movable and mounted on the notch portion NP of the base 52 in the same manner as the connector 53.

As described above, the board terminal group is provided on only one of the long sides in the resistance module 31, is inserted into the connecting port CP of the connector 53 and is not provided on the opposite long side of the resistance module 31 but is inserted into the connecting port CP of the connector 542 to support the resistance module 31. Of course, a terminal group may be provided in an opposite edge portion of the resistance module 31 and does not need to be electrically connected to the chip resistor.

Moreover, the connector 542 does not need to have the connecting port CP on two long sides differently from the connector 53 and it is sufficient that the connecting port CP is provided on only one of the long sides. Furthermore, the connector 53 may be used in place of the connector 542. In that case, nothing is inserted into the connecting port CP opposite to the connecting port CP to which the resistance module 31 is connected.

It is apparent that the resistance module 31 connected to the connector 53 may be slid over the notch portion NP to insert one of the edge portions thereof into the connecting port CP of the connector 542.

Next, the module system 51 can be assembled by repeating an operation for providing the memory module 21 such that one of the board terminal groups is connected to the other connecting port CP of the connector 53.

The connectors 542 and 53 are movable. Therefore, it is easy to connect the memory module 21 positioned on the end opposite to the resistance module 31 to the connector 541.

Figure 14:
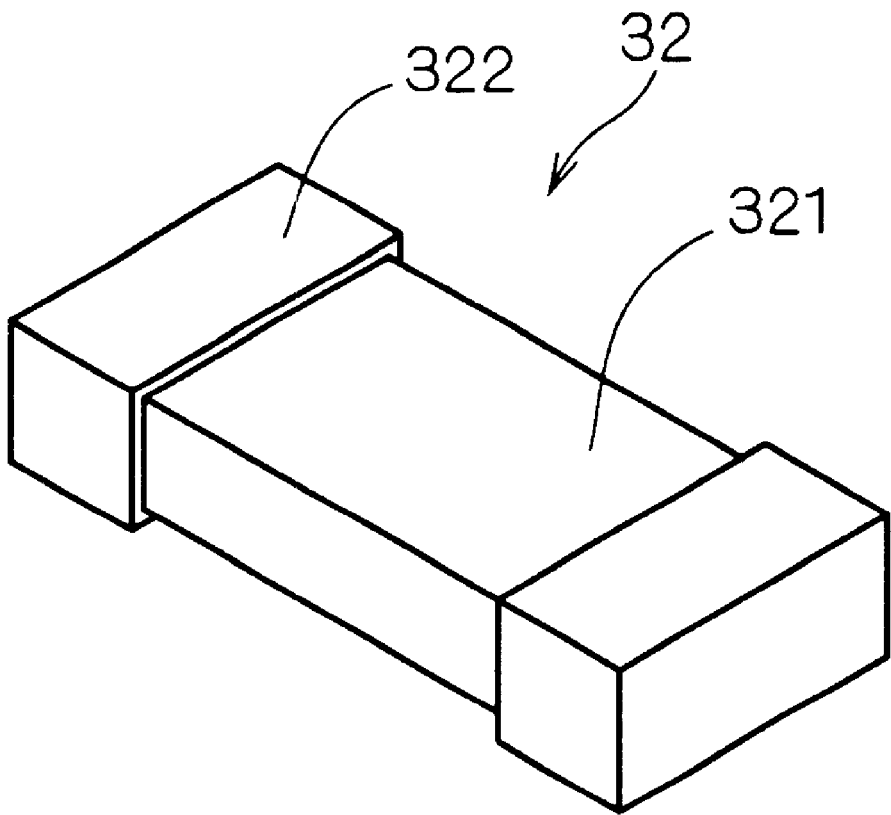
FIG. 14 is a perspective view showing a structure of a chip resistor.

The structure of the chip resistor 32 shown in FIG. 13 is illustrated in a perspective view of FIG. 14. The chip resistor 32 has a rectangular parallelepiped resistor 321 and an electrode 322 provided on both ends of the resistor 321, and is used with the electrode 322 connected to predetermined printed wirings through soldering or the like and is generally put on the market. In some cases, there is employed such a structure that the electrode 322 is formed of a solder material to easily carry out a soldering work.

Although the memory modules 21 are electrically connected to each other through the connector 53 in the module system 51 as described above, all the memory modules are not operated at the same time but are usually operated in a memory module unit. In the storage operation of the module system 51, accordingly, it is necessary to select one of the memory modules 21. For this purpose, information (a module number and the like) about the mounted modules are previously stored in each DRAM 22 together with inherent information (a DRAM number) for the DRAM 22. At the beginning of a memory operation cycle, preferably, a CPU (Central Processing Unit) or the like accesses the inherent information of the DRAM 22 for carrying out a memory operation based on the DRAM number specified for the memory operation. In that case, it is preferable that data on the information of the module should be acquired and a memory module mounting the DRAM 22 for carrying out the memory operation should be selected.

Characteristic impedances of the connectors 541, 542 and 53 are made identical to those of the memory module 21 and the resistance module 31 in the same manner as in the mother board MB.

<A-3. Functions and Effects>

As described above, the module system 51 includes the memory modules 21 having the DRAMs 22. The memory modules 21 are electrically connected to each other at a short distance through the connection of the connector 53 to the board terminal groups TGA and TG13 provided on both ends of the main surface of the multilayer printed circuit board 1. Therefore, the branch length on the same transmission path can be decreased and the parasitic capacitance and the- parasitic inductance which are incidental to the signal transmission path can be reduced. Accordingly, it is possible to prevent the mismatch of the impedances between the driver circuit for outputting the signal to be input to the memory module 21 and the transmission path. Moreover, it is possible to prevent the distortion of the signal, for example, the generation of an overshoot or undershoot on a signal waveform.

Moreover, the memory modules 21 can easily be connected electrically. Thus, a large capacity module system can readily be implemented.

<A-4. First Variant of Memory Module>

While the memory module 21 has the DRAMs 22 provided in one line in the embodiment according, to the present invention described above, the array of the DRAMs 22 is not restricted to one line.

Figure 15:
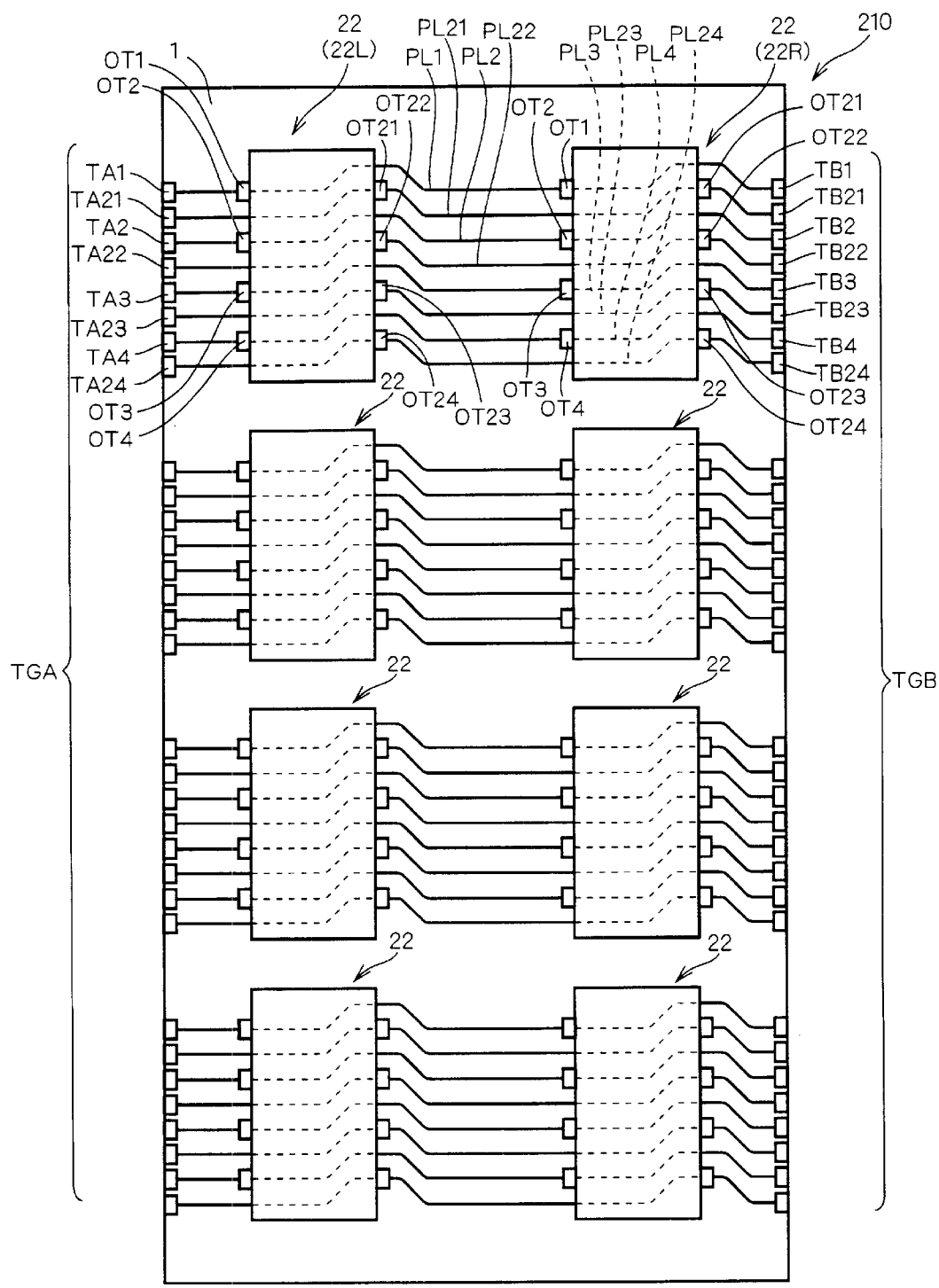
FIGS. 15 and 16 are plan views showing a variant of the basic structure of the semiconductor memory module according to the present invention.

As in a memory module 210 shown in FIG. 15, for example, four DRAMs 22 may be provided in one line corresponding to a direction of arrangement of external terminals thereof and may be provided in parallel with the same array.

In the following description, two DRAMs 22 in the endmost portion will be taken as an example and the description of other DRAMs 22 will be omitted.

All the DRAMs 22 shown in FIG. 15 have the same structures. The same portions have the same reference numerals. For convenience, the left and right sides in the drawing will be ref:erred to as a DRAM 22L and a DRAM 22R, respectively.

As shown in FIG. 15, the electrical connecting relationship between each of external terminals of the DRAMs 22 and each of board terminals of a multilayer printed circuit board 1 is basically identical to that of the memory module 21 shown in FIG. 1. However, since the lines of the DRAMs 22 are provided in parallel, a wiring path is slightly different.

For specific connection, aboard terminal TA1 of the memory module 210 and an electrode (not shown) to which an external terminal OT1 of the DRAM 22L is connected, the electrode to which the external terminal OT1 of the DRAM 22L is connected and an electrode to which an external terminal OT1 of the DRAM 22R is connected, and the electrode to which the external terminal OT1 of the DRAM 22R is connected and a board terminal TB1 are electrically connected through a printed wiring PL1 provided on an upper main surface of the multilayer printed circuit board 1.

Similarly, a board terminal TA21 is electrically connected to an external terminal OT21 of the DRAM 22L, an external terminal OT21 of the DRAM 22R and a board terminal TB21 through a printed wiring PL21, a board terminal TA2 is electrically connected to an external terminal OT2 of the DRAM 22L, an external terminal OT2 of the DRAM 22R and a board terminal TB2 through a printed wiring PL2, a board terminal TA22 is electrically connected to an external terminal OT22 of the DRAM 22L, an external terminal OTL22 of the DRAM 22R and a board terminal TB22 through a printed wiring PL22, a board terminal TA3 is electrically connected to an external terminal OT3 of the DRAM 22L, an external terminal OT3 of the DRAM 22R and a board terminal TB3 through a printed wiring PL3, a board terminal TA23 is electrically connected to an external terminal OTL3 of the DRAM 22L, an external terminal OT23 of the DRAM 22R and a board terminal TB23 through a printed wiring PL23, a board terminal TA4 is electrically connected to an external terminal OT4 of the DRAM 22L, an external terminal OT4 of the DRAM 22R and a board terminal TB4 through a printed wiring PL4, and a board terminal TA24 is electrically connected to an external terminal OT24 of the DRAM 22L, an external terminal OT24 of the DRAM 22R and a board terminal TB24 through a printed wiring PL24.

Thus, the DRAMs 22 are provided in a plurality of lines on one multilayer printed circuit board 1. Consequently, a mounting density of the DRAM 22 can be enhanced and a memory capacity of the module system can be increased rapidly.

While the memory module 210 has the DRAMs 22 provided in two lines in the above description, the DRAMs 22 may be arranged in two or more lines or two DRAMs 22 may be provided transversely in one line such that external terminals thereof are parallel with each other. More specifically, only the DRAMs 22R and 22L shown in FIG. 15 may be provided on the multilayer printed circuit board 1.

<A-5. Second Variant of Memory Module>

Figure 16:
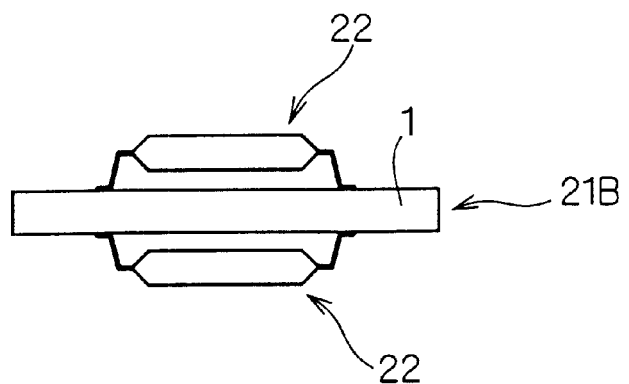

While the memory module 21 has the DRAM 22 provided on only one of the main surfaces in the embodiment according to the present invention described above, the DRAM 22 may be mounted on both main surfaces as in a memory module 21B shown in FIG. 16.

In that case, both main surfaces may have the structures described with reference to FIG. 1 or a part of the printed wiring may be provided on a lower board constituting the multilayer printed circuit board 1 as described with reference to FIG. 2 so that a wiring density can be reduced.

<A-6. Third Variant of Memory Module>

Figure 17:
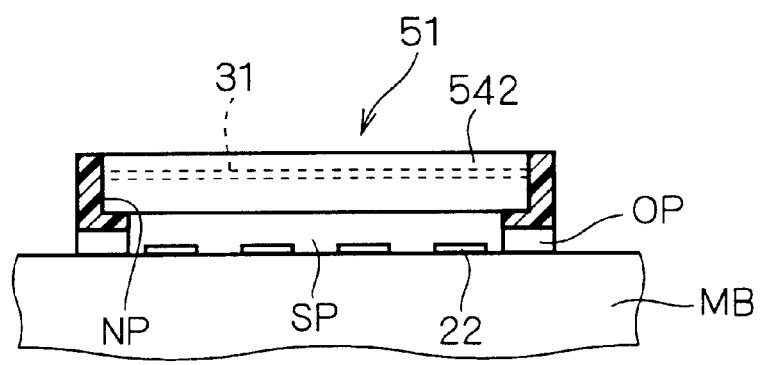
FIG. 17 is a view showing a structure in which the number of memory modules to be mounted increased.

While the ex;ample in which the memory module 21 is provided on the module system 51 and the DRAM 22 is mounted on only the memory module 21 has been described in the embodiment according to the present invention, a structure shown in FIG. 17 may be employed.

More specifically, FIG. 17 is a sectional view showing the module system 51 of FIG. 6 taken along the line C—C in the same manner as FIG. 9, in which a DRAM 22 is provided on a mother board MB in a region enclosed by a base 52.

With such a structure, a mounting density of the DRAM 22 can further be enhanced and a memory capacity of the module system can be increased.

<A-7. Fourth Variant of Memory Module>

Figure 18:
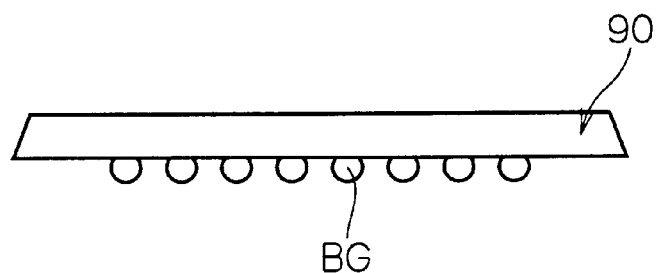
FIG. 18 is a view illustrating a structure of a BGA package.

While only the structure in which the DRAM 22 referred to as the so-called type 2 of the TSOP is mounted on the memory module 21 has been described in the embodiment according to the present invention, a configuration of a DRAM package is not restricted thereto but a BGA (Ball Grid Array) package 90 having a plurality of ball-shaped external terminals BG provided on a lower main surface of a package body can also be used as shown in FIG. 18.

Moreover, the semiconductor memory is not restricted to the DRAM but the present invention can be applied to any semiconductor memory such as a SRAM (Static Random Access Memory) or a ROM (Read Only Memory).

<A-8. Structure of Resistance Module>

Figure 19:
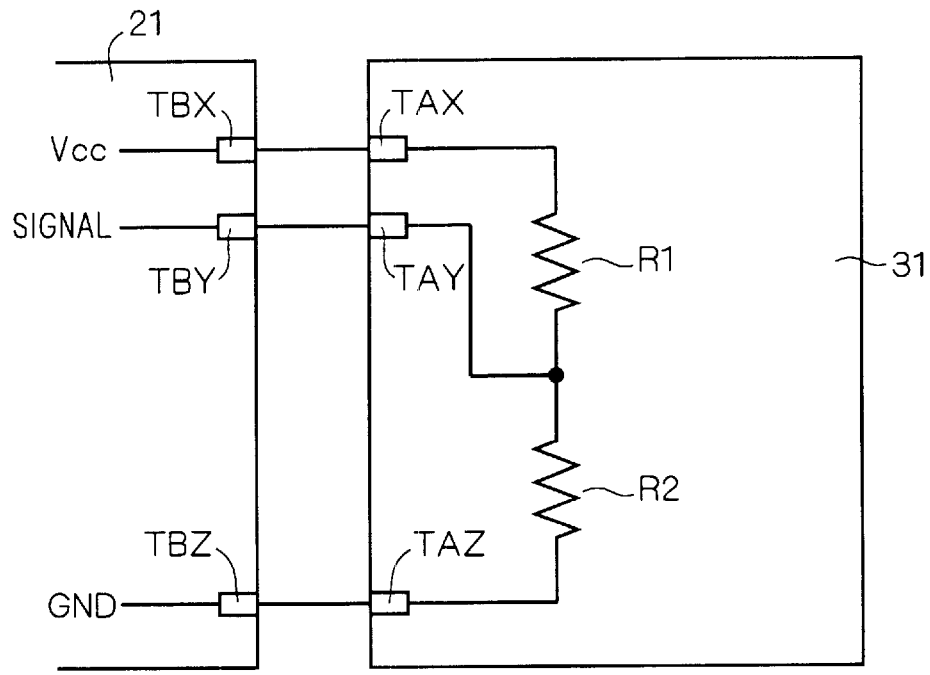
FIGS. 19 and 20 are views showing a structure of a resistance module.
Figure 20:
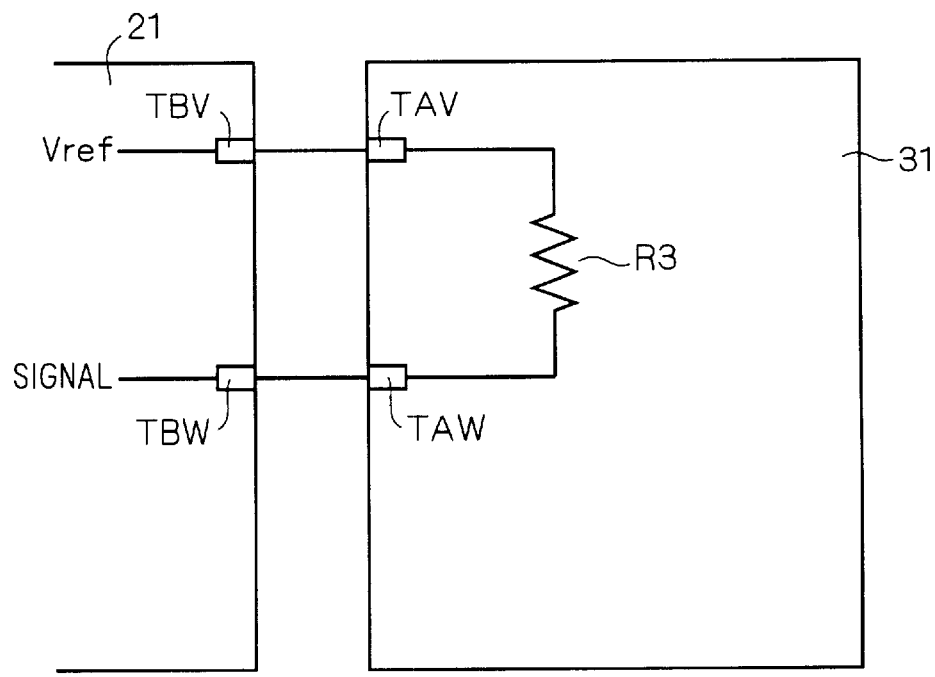

Examples of a structure in which a signal wiring is terminated by using a terminating resistor 32 include structures shown in FIGS. 19 and 20.

In a resistance module 31 shown in FIG. 19, terminating resistors R1 and R2 connected in series between board terminals TAX and TAZ are provided and a board terminal TAY is connected to a node of the terminating resistors R1 and R2. The board terminal TAX is electrically connected to a board terminal TBX to be a power (Vcc) terminal of a memory module 21 (through a connector 53 which is not shown), the board terminal TBX is electrically connected to a board terminal TBZ to be a ground (GND) terminal of the memory module 21 (through the connector 53 which is not shown), and the board terminal TAY is electrically connected to a board terminal TBY to be a signal terminal of the memory module 21 (through the connector 53 which is not shown).

In a resistance module 31 shown in FIG. 20, a terminating resistor R3 connected between board terminals TAV and TAW is provided, the board terminal TAV is electrically connected to a board terminal TBV to be a reference voltage source (Vref) terminal of a memory module 21 (through a connector 53 which is not shown), and the board terminal TAW is electrically connected to a board terminal TBW to be a signal terminal of the memory module 21 (through the connector 53 which is not shown).

With the above-mentioned structure, the signal wiring can be terminated on the module system 51 and the resistance module 31 can be provided with an external terminal group on only one of the long sides thereof.

<A-9. First Variant of Module System>

The module system 51 described with reference to FIG. 6 has a plurality of memory modules 21 arranged in a direction of a short side, that is, a direction in which the board terminals groups TGA and TGB are connected (see FIG. 1). More specifically, while the memory modules 21 are arranged on a plane basis, the main surfaces of the memory modules 21 may be opposed to each other as in a module system 60 shown in FIG. 21.

Figure 21:
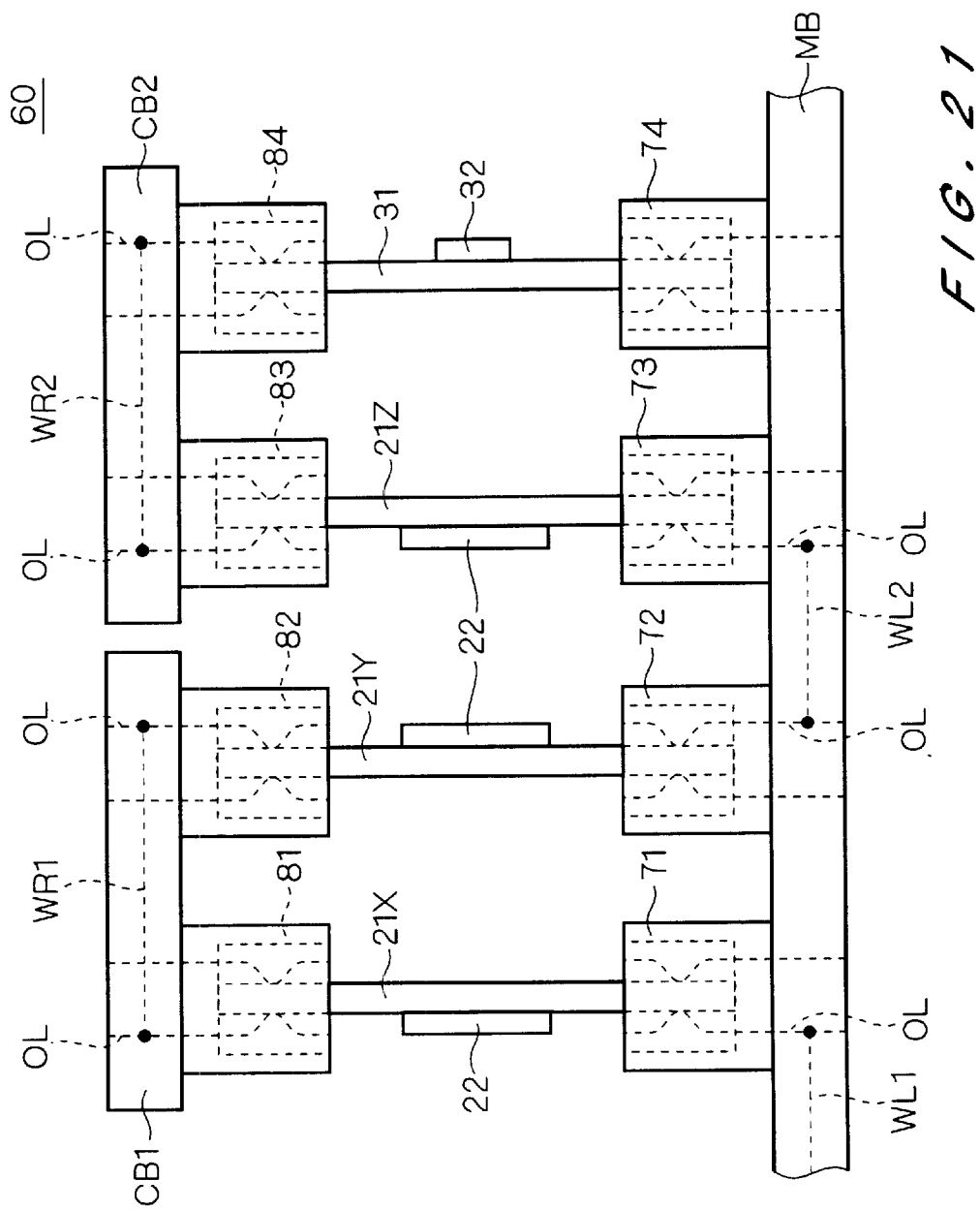
FIG. 21 is a side view showing a structure of a module system according to a first variant.

The memory module system 60 shown in FIG. 21 has such a structure that three memory modules 21X), 21Y and 21Z and a resistance module 31 are incorporated as an example. The memory modules 21X to 21Z are the same as the memory module 21 shown in FIG. 1, and different reference numerals are used for the sake of convenience. Moreover, while the memory modules 21X to 21Z having a DRAM 22 provided on only one of main surfaces will be taken as an example for the sake of convenience in the following description,, the memory module 21B having the DRAM 22 provided on both main surfaces as shown in FIG.

16 may be used or the memory module 210 having the DRAM 22 provided in plural stages as shown in FIG. 15 may be used.

FIG. 21 shows a side surface of the module system 60 in which connectors 71 to 74 are provided with connecting ports turned upward on a mother board MB. The connectors 71 to 74 are provided at regular intervals in parallel with each other. Connectors 81 to 84 have the same structures as those of the connectors 71 to 74, respectively. The connectors 81 and 82 are provided on a connecting board CB1 and the connectors 83 and 84 are provided on a connecting board CB2. The memory module 21X (first module) is inserted in the connectors 71 and 81, the memory module 21Y (second module) is inserted in the connectors 72 and 82, the memory module 21Z is inserted in the connectors 73 and 83, and the resistance module 31 is inserted in the connectors 74 and 84.

The memory modules 21X to 21Z are provided with board terminal groups along two long sides in the same manner as the memory module 21 described with reference to FIG. 1, and one of the long sides is inserted in each of the connectors 71 to 73 and the other long side is inserted in each of the connectors 81 to 83.

As described above, the board terminal group of the resistance module 31 is provided on only one of the long sides. In FIG. 21, the long side having no board terminal group is inserted in the connector 74 and the long side having the board terminal group is inserted in the connector 84.

In the same manner as in the mother board MB, characteristic impedances of the connecting boards CB1 and CB2 are similar to those of the memory module 21 and the resistance module 31.

Figure 22:
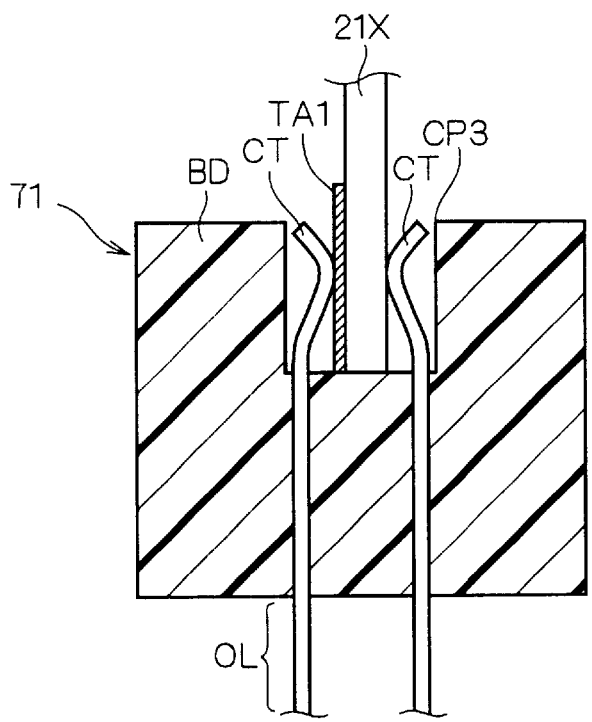
FIG. 22 is a sectional view showing a structure of a connector for connecting a memory module.

A structure of the connector 71 will be described below with reference to FIG. 22. FIG. 22 is a sectional view showing the structure of the connector 71 in which a connecting portion CP3 to be a concave part is provided on a long side extended in a direction of arrangement of the DRAM of the memory module 21X in a slender body portion BD formed of a resin such as plastics.

The connecting portion CP3 has plural pairs of contactors CT provided through the body portion BD electrically independently corresponding to each of the board terminals of the memory module 21X. Any of the board terminal groups of the memory module 21X (one of the board terminal groups TGA and TGB of the memory module 21 in FIG. 1) is inserted in the connecting portion CP3, and any of the board terminals comes in contact with the contractor CT.

FIG. 22 shows a structure in which the board terminal group TGA is inserted in the connecting portion CP3 and a board terminal TA1 comes in contact with the contactor CT.

A plurality of external leads OL to be electrically connected to each contactor CT perpendicularly to the main surface are extended from a long side on the opposite side of the contactor CT of the body portion BD.

The external lead OL is inserted in a through hole provided perpendicularly to a main surface of the mother board MB and is soldered. Consequently, the connector 71 is fixed and the external lead OL is electrically connected to a wiring provided in the mother board MB constituted by a multilayer printed circuit board.

While the connector 71 has been described above, the connectors 72 to 74 and the connectors 81 to 84 have the same structures. The external lead OL is inserted in through holes provided perpendicularly to main surfaces of the connecting boards CB1 and CB2 and a tip portion of the external lead OL which is protruded from the through holes is soldered. Consequently, the connectors 81 to 84 are fixed and the external lead OL is electrically connected to wirings provided in the connecting boards CB1 and CB2 constituted by multilayer printed circuit boards.

Returning to FIG. 21, the memory modules 21X and 21Y are provided to make a pair such that main surfaces having DRAMs 22 provided thereon are turned in opposite directions to each other, and the memory module 21Z and the resistance module 31 are provided such that main surfaces having the DRAM 22 and a chip resistor 32 provided thereon are turned in opposite directions to each other. In the memory modules 21Y and 21Z making no pair, therefore, the main surfaces having the DRAMs 22 provided thereon are opposed to each other.

With such an arrangement, the mother board MB is constituted such that the external lead OL on the DRAM 22 side of the connector 71 is connected to a wiring WL1 in the mother board MB and the external lead OL on the DRAM 22 side of the connector 72 and the eternal lead OL on the DRAM 22 side of the connector 73 are electrically connected through a wiring WL2 in the mother board MB.

Moreover, the connecting board CB1 is constituted such that the external lead OL on the DRAM 22 side of the connector 81 and the external lead OL on the DRAM 22 side of the connector 82 are electrically connected through a wiring WR1 provided in the connecting board CB1 formed by a multilayer printed circuit board.

Furthermore, the connecting board CB2 is constituted such that the external lead OL on the DRAM 22 side of the connector 83 and the external lead OL on the chip resistor 32 side of the connector 84 are electrically connected through a wiring WR2 provided in the connecting board CB2 formed by a multilayer printed circuit board.

As in the module system 60 shown in FIG. 21, the memory module 21 is provided perpendicularly to the main surface of the mother board MB and the main surfaces of the memory modules 21 are opposed to each other. Consequently, an area occupied by the module system on the mother board MB can be reduced and a module system having a small size and a large capacity can be obtained.

While the two memory modules 21 are connected to the connecting boards CB1 and CB2 in the above description, this structure is not restricted but it is apparent that more memory modules 21 may be connected. Moreover, all of the memory modules 21 and the resistance module 31 may be connected through one connecting board.

In a connecting board in which at least two memory modules 21 are connected, for example, the connecting boards CB1 and CB2, more memory modules can be provided little by little FIGS. 23 to 26 illustrate the detailed structure of the connecting portion of the external lead OL of the connector 71 and the wiring WL1.

Figure 23:
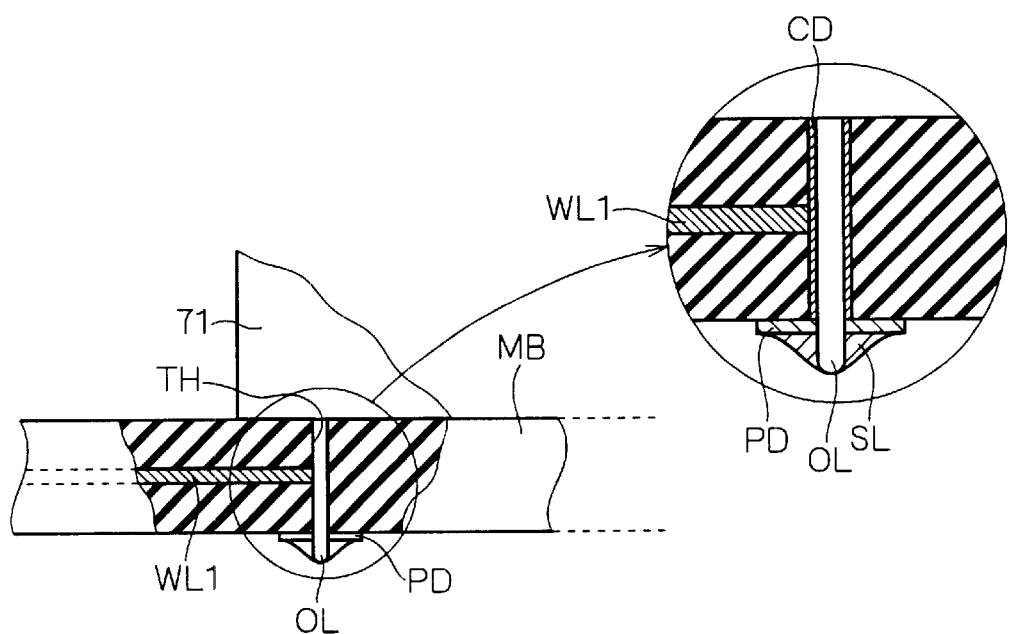

As shown in FIG. 23, a through hole TH provided perpendicularly to the main surface of the mother board MB and the wiring WL1 are electrically connected through a conductor layer CD provided to cover an internal wall of the through hole TH. When the external lead OL is inserted, it comes in close contact with the conductor layer CD and is electrically connected thereto. Thus, the wiring WL1 and the external lead OL are electrically connected to each other.

A pad electrode PD to be connected to the conductor layer CD is provided around the through hole TH on the back face side of the mother board MB. A tip portion of the external lead OL protruded from the through hole TH is fixed to the pad electrode PD through a solder SL so that the external lead OL can be electrically connected to the conductor layer CD more reliably.

Figure 24:
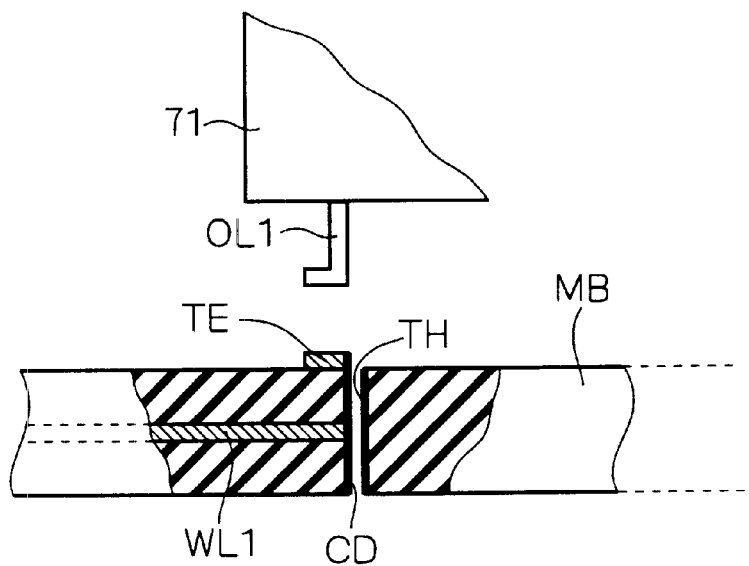

FIG. 24 shows a structure in which the external lead is not directly inserted in the through hole TH but an external lead OL1 of the connector 71 is mounted on a terminal TE provided in a position on the mother board MB that is adjacent to the through hole TH.

The wiring WL1 in the mother board MB is electrically connected to the conductor layer CD provided to cover the internal wall of the through hole TH, and the terminal TE is provided to be electrically connected to the conductor layer CD.

In order to reliably obtain connection to the terminal TE, a tip portion of the external lead OL1 is bent. The external lead OL1 and the terminal TE are fixed through soldering and the external lead OL1 and the wiring WL1 are electrically connected to each other.

Figure 25:
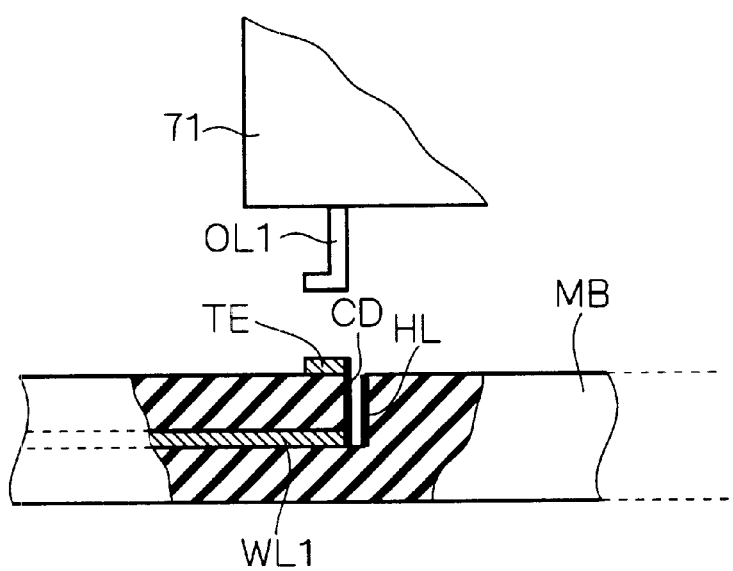
Figure 21:
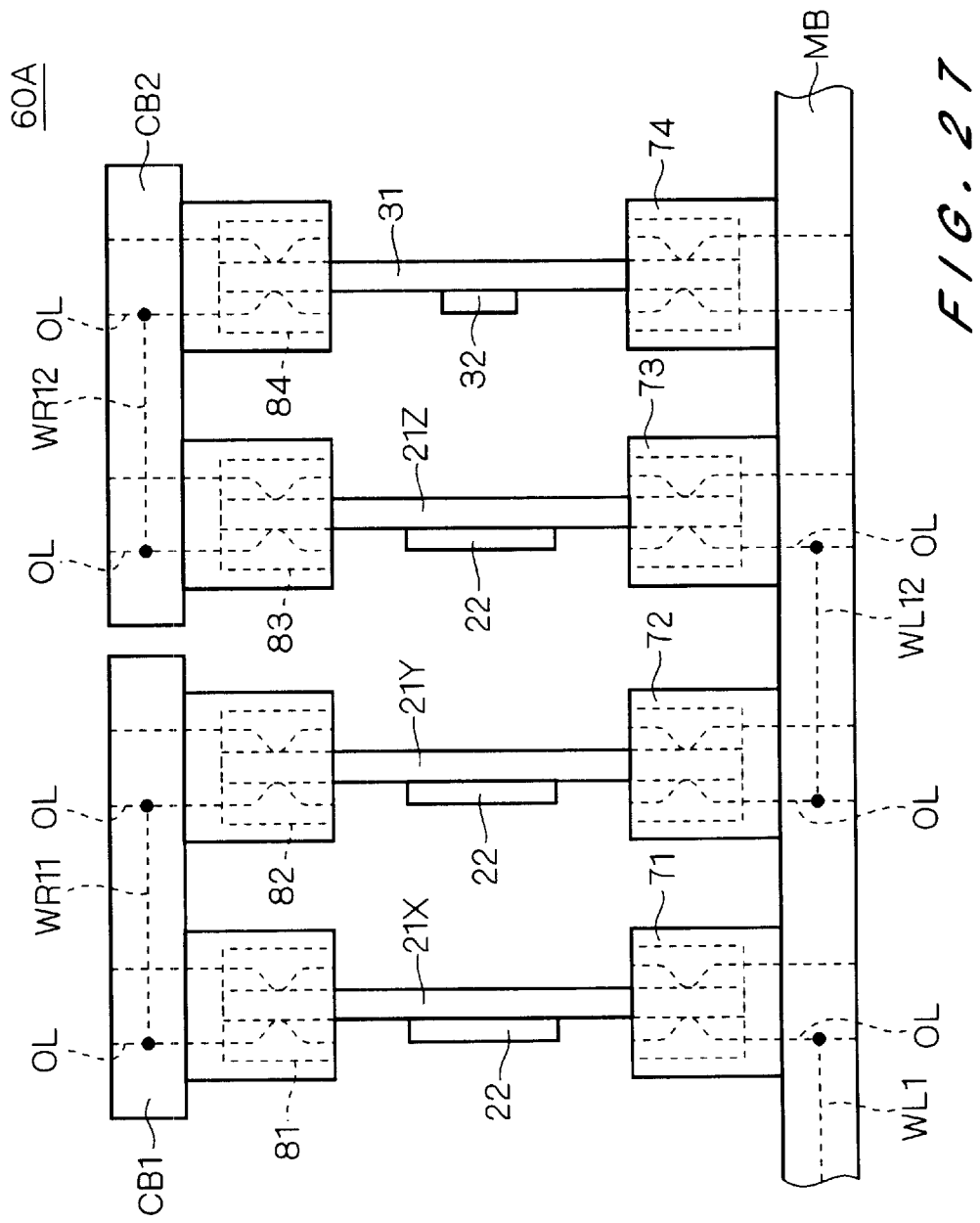

FIG. 25 shows the same structure as that of FIG. 24. In FIG. 25, the terminal TE is provided in a position adjacent to a non-through hole HL in place of a through hole, the conductive layer CD is provided to cover an internal wall of the non-through hole HL and the terminal TE is provided to be electrically connected to the conductor layer CD. Other structures are the same as those in FIG. 24.

FIG. 26 shows a structure in which the wiring WL1 is not provided in the mother board MB but on a main surface thereof and is connected to the terminal TE on the mother board MB and the external lead OL1 is connected to the terminal TE.

While the connection of the external lead OL of the connector 71 and the wiring WL1 of the mother board MB has been described above, the connectors 72 to 74 also have the same structures, and furthermore, the connecting boards CB1 and CB2 and the connectors 81 to 84 have the same structures.

<A-10. Second Variant of Module System>

In the module system 60 described with reference to FIG. 21, the main surfaces of the memory modules 21X and 21Y on which the DRAMs 22 are provided are turned in opposite directions, the main surfaces of the memory module 21Z and the resistance module 31 on which the DRAM 22 and the chip resistor 32 are provided are turned in opposite directions, and the main surfaces of the memory modules 21Y and 21Z on which the DRAMs 22 are provided are opposed to each other. As in a module system 60A shown in FIG. 27, main surfaces of memory modules 21X to 21Z and a resistance module 31 on which a DRAMA 22 and a chip resistor 32 are provided may be turned in the same direction.

With such an arrangement, an external lead OL on the DRAM 22 side of a connector 71 is connected to a wiring WL1 in a mother board MB in the same manner as in the module system 60. The mother board MB is constituted such that the external lead OL on the DRAM 22 side of a connector 72 and the external lead OL on the DRAM 22 side of a connector 73 are electrically connected through a wiring WL12 in the mother board MB.

Moreover, a connecting board CB1 is constituted such that the external lead OL on the DRAM 22 side of a connector 81 and the external lead OL on the DRAM 22 side of a connector 82 are electrically connected through a wiring WR11 in the connecting board CB1 constituted by a multilayer printed circuit board.

Furthermore, a connecting board CB2 is constituted such that the external lead OL on the DRAM 22 side of a connector 83 and the external lead OL on the chip resistor 32 side of a connector 84 are electrically connected through a wiring WR12 in the connecting board CB2 constituted by a multilayer printed circuit board.

The same strictures as those of the module system 60 shown in FIG. 21 have the same reference numerals and repetitive description will be omitted.

The module system 60A features that regular intervals of the connectors 71 to 74 to be provided can cause lengths of the wirings. WL12, WR11 and WR12 to be equal to each other, for example, can cause a propagation delay time of an address signal to be equal and set-up times or hold times of all the address signals to be equal, thereby preventing a decrease in an operating margin of the memory module.

<A-11. Third Variant of Module System>

While the memory modules 21X to 21Z and the resistance module 31 are provided such that the main surfaces thereof are perpendicular to the main surface of the mother board MB in the module systems 60 and 60A described with reference to FIGS. 21 and 27, each of main surfaces of memory modules 21X to 21Z and a resistance module 31 may be inclined to a mother board MB as in a module system 60B shown in FIG. 28.

In FIG. 28, connectors 711, 721, 731 and 741 having connecting ports turned obliquely upward to a main surface of the mother board MB are provided. Each of the connectors 711, 721, 7.31 and 741 has a base portion BS provided in parallel at an interval and a head portion HD inclined obliquely at an almost equal angle with respect to the base portion BS, the head portion HD being provided with a connecting port to a module board, in which one of long sides of each of the memory modules 21X to 21Z and the resistance module 31 is inserted.

Moreover, the other long side of each of the memory modules 21X to 21Z and the resistance module 31 is inserted in each of connectors 811, 821, 831 and 841. The connectors 811 and 821 are provided on a connecting board CB1 and the connectors 831 and 841 are provided on a connecting board CB2.

These connectors have the shape of a simple rectangular parallelepiped, and the connectors 811 and 8:31 have greater heights from the board than those of the connectors 821 and 841 to correct a difference between distances from the memory modules 21X and 21Y provided obliquely to a main surface of the connecting board CB1 and a difference between distances from the memory module 21Z and the resistance module 31 to a main surface of the connecting board CB2.

The same structures as those of the module system 60 shown in FIG. 21 have the same reference numerals and repetitive description will be omitted.

With the above-mentioned structure, an area occupied by the module system on the mother board MB can be reduced and a module system having a small size and a large capacity can be obtained.

While board terminals of the memory modules 21X to 21Z and the resistance module 31 are electrically connected through the connecting boards CB1 and CB2 in the first to third variants of the module system described above, the connection using the connecting board is not restricted but any structure for connection may be employed if the board terminals of the memory modules 21X to 21Z and the resistance module 31 can be connected electrically.

By taking FIG. 28 as an example, the connectors 811 and 821 and the connectors 831 and 841 may be connected through a flexible wiring in place of the wirings WR1 and WR2, respectively. In the case in which the connection is carried out through the flexible wiring, it is not necessary to use connectors having different heights, for example, the connectors 811 and 831 and the connectors 821 and 841, and a difference in a distance can be corrected depending on a wiring length by using the same kind of connectors. Therefore, it is possible to increase the degree of freedom of a configuration in which the memory module is provided.

In the case in which the connecting board is used, the wiring length between the connectors is not changed and the connectors are fixed. Therefore, it is possible to obtain an advantage that the memory module can be fixed reliably.

While the invention has been described in detail, the foregoing description is in all aspects illustrative and not restrictive. It is understood that numerous other modifications and variations can be devised without departing from the scope of the invention.

What is claimed is:

1. A semiconductor memory module comprising:
    a wiring board;
    at least one semiconductor memory provided on at least one main surface of said wiring board and having a plurality of external terminals;
    a plurality of first board terminals and a plurality of second board terminals which are provided line symmetrically with respect to two opposed sides of said wiring board corresponding to said plurality of external terminals, respectively; and
    a wiring for electrically connecting one of said plurality of external terminals to one pair of said plurality of first and second board terminals corresponding thereto.

2. The semiconductor memory module according to claim 1, wherein said at least one semiconductor memory is a plurality of semiconductor memories, and
    said plurality of external terminals of said semiconductor memories and said plurality of first and second board terminals are provided in the same direction.

3. The semiconductor memory module according to claim 2, wherein said plurality of semiconductor memories are provided in a plurality of lines in parallel with each other.

4. The semiconductor memory module according to claim 2, wherein said wiring board has first and second main surfaces,
    said first main surface including:
        a first group of semiconductor memories having at least one of said plurality of semiconductor memories; and
        said plurality of first and second board terminals corresponding to said plurality of external terminals of said first group of semiconductor memories and said wiring connecting said plurality of first and second board terminals provided on said first main surface, and
    said second main surface including:
        a second group of semiconductor memories having at least one of said plurality of semiconductor memories; and
        said plurality of first and second board terminals corresponding to said plurality of external terminals of said second group of semiconductor memories and said wiring connecting said plurality of first and second board terminals provided on said second main surface.

5. The semiconductor memory module according to claim 1, wherein said wiring board is a multilayer printed circuit board having a plurality of boards provided thereon, and
    a part of said wiring is provided on a board in said multilayer printed circuit board.

6. The semiconductor memory module according to claim 1, wherein said wiring board has first and second main surfaces,
    said at least one semiconductor memory is provided on said first main surface of said wiring board, and
    a part of said wiring is provided on said second main surface.

7. A module system mounting a plurality of semiconductor memory modules comprising a wiring board, at least one semiconductor memory provided on at least one main surface of said wiring board and having a plurality of external terminals, a plurality of first board terminals and a plurality of second board terminals which are provided line symmetrically with respect to two opposed sides of said wiring board corresponding to said plurality of external terminals, respectively, and a wiring for electrically connecting one of said plurality of external terminals to one pair of said plurality of first and second board terminals corresponding thereto, comprising:
    at least one first connector for electrically connecting said semiconductor memory modules; and
    a base mounting said at least one first connector and said semiconductor memory modules connected to said at least one first connector,
    said at least one first connector having a connecting portion connecting said plurality of first and second board terminals to respective side surfaces of two sides parallel with a direction in which said first and second board terminals are arranged.

8. The module system according to claim 7, wherein said base has a second connector fixedly provided on one of ends in a direction of array of said plurality of semiconductor memory modules,
    said second connector being connected to any of said plurality of first and second board terminals in said plurality of semiconductor memory modules which is not connected to said at least one first connector.

9. The module system according to claim 8, further comprising a resistance module mounting a plurality of resistive elements having one of ends electrically connected to any of said plurality of first and second board terminals and the other end electrically connected to any of said plurality of first and second board terminals through said at least one first connector.

10. A module system mounting a plurality of semiconductor memory modules comprising a wiring board, at least one semiconductor memory provided on at least one main surface of said wiring board and having a plurality of external terminals, a plurality of first board terminals and a plurality of second board terminals which are provided line symmetrically with respect to two opposed sides of said wiring board corresponding to said plurality of external terminals, respectively, and a wiring for electrically connecting one of said plurality of external terminals to one pair of said plurality of first and second board terminals corresponding thereto, said main surfaces of said semiconductor memory modules being opposed to each other,
    said module system comprising:
        a board and a connecting structure, said semiconductor memory modules being divided into
        at least one first module in which said first board terminals are connected to at least one first connector mounted on said board; and
        at least one second module in which said second board terminals are connected to at least one second connector mounted on said board;
        said second board terminals of said at least one first module being connected to at least one third connector,
        said first board terminals of said at least one second module being connected to at least one fourth connector,
        said at least one third connector and said at least one fourth connector being electrically connected through said connecting structure, and said at least one first module and said at least one second module being alternately provided.

11. The module system according to claim 10, wherein said connecting structure is a connecting board for mounting said at least one third connector and said at least one fourth connector and for electrically connecting said at least one third connector and said at least one fourth connector through a wiring provided on a main surface or an inner part thereof.

12. The module system according to claim 10, wherein said at least one first module and said at least one second module are provided to make a pair such that respective main surfaces on a side where said at least one semiconductor memory is provided are turned in opposite directions.

13. The module system according to claim 10, wherein said first and second modules are provided such that respective main surfaces on a side where said at least one semiconductor memory is provided are turned in the same direction.

14. The module system according to claim 10, wherein said first and second modules have respective main surfaces provided perpendicularly to said main surface of said board.

15. The module system according to claim 10, wherein said first and second modules have respective main surfaces inclined to said main surface of said board.

* * * * *